(12) United States Patent
Kwag et al.

(10) Patent No.: US 12,100,728 B2
(45) Date of Patent: Sep. 24, 2024

(54) DISPLAY DEVICE

(71) Applicant: SAMSUNG DISPLAY CO., LTD., Yongin-si (KR)

(72) Inventors: Jin Oh Kwag, Yongin-si (KR); Jong Hyuk Kang, Yongin-si (KR); Keun Kyu Song, Yongin-si (KR); Sung-Chan Jo, Yongin-si (KR); Hyun Min Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 713 days.

(21) Appl. No.: 17/285,689

(22) PCT Filed: Apr. 15, 2019

(86) PCT No.: PCT/KR2019/004526
§ 371 (c)(1),
(2) Date: Apr. 15, 2021

(87) PCT Pub. No.: WO2020/080624
PCT Pub. Date: Apr. 23, 2020

(65) Prior Publication Data
US 2021/0343784 A1    Nov. 4, 2021

(30) Foreign Application Priority Data
Oct. 16, 2018  (KR) .................. 10-2018-0123414

(51) Int. Cl.
*H01L 27/12*  (2006.01)
*H01L 27/15*  (2006.01)
(Continued)

(52) U.S. Cl.
CPC ...... *H01L 27/156* (2013.01); *H01L 29/78633* (2013.01); *H01L 33/24* (2013.01); *H01L 33/38* (2013.01); *H01L 33/62* (2013.01)

(58) Field of Classification Search
CPC ... H01L 27/156; H01L 33/62; H01L 27/1214; H01L 25/167; H01L 25/0753
See application file for complete search history.

(56) References Cited

U.S. PATENT DOCUMENTS 9,263,704 B2    2/2016   Yoo et al.
9,343,484 B2    5/2016   Park et al.
(Continued)

FOREIGN PATENT DOCUMENTS

| CN | 104752482 | 7/2015 |
| CN | 107818755 | 3/2018 |

(Continued)

OTHER PUBLICATIONS

International Search Report, with English translation, corresponding to International Application No. PCT/KR2019/004526 dated Jul. 23, 2019.

(Continued)

*Primary Examiner* — Bilkis Jahan
(74) *Attorney, Agent, or Firm* — KILE PARK REED & HOUTTEMAN PLLC

(57) ABSTRACT

A display device comprises a substrate including a display area and a non-display area, and pixels disposed in the display area, each of the pixels including sub-pixels. Each of sub-pixels includes a pixel circuit layer, and a display element layer including at least one light emitting element. The display element layer includes first and second electrodes spaced apart from each other, the light emitting element disposed between the first electrode and second electrode, a first contact electrode that electrically connects an end of the light emitting element to the first electrode, and a second contact electrode that electrically connects another end of the light emitting element to the second electrode. Each of sub-pixels includes a first area in which the pixel circuit layer is disposed, and a second area adjacent to the (Continued)

first area. The second area includes a transmission area through which the light passes.

24 Claims, 22 Drawing Sheets

(51) Int. Cl.
   *H01L 29/786* (2006.01)
   *H01L 33/24* (2010.01)
   *H01L 33/38* (2010.01)
   *H01L 33/62* (2010.01)

(56) References Cited

U.S. PATENT DOCUMENTS

| | | | |
|---|---|---|---|
| 10,325,936 B2 | 6/2019 | Kang et al. | |
| 10,461,123 B2 | 10/2019 | Kim et al. | |
| 10,672,946 B2 | 6/2020 | Cho et al. | |
| 10,720,606 B2 | 7/2020 | Song et al. | |
| 10,818,647 B2 | 10/2020 | Kim et al. | |
| 10,943,967 B2 | 3/2021 | Kim et al. | |
| 2007/0103061 A1* | 5/2007 | Li | H10K 59/12 313/504 |
| 2015/0200236 A1* | 7/2015 | Kim | H10K 59/121 438/35 |
| 2016/0111487 A1* | 4/2016 | Jeong | H10K 59/1315 257/40 |
| 2017/0092894 A1* | 3/2017 | Yang | H10K 59/121 |
| 2018/0145118 A1* | 5/2018 | Kim | H10K 71/00 |
| 2018/0175009 A1* | 6/2018 | Kim | H01L 33/20 |
| 2018/0175106 A1 | 6/2018 | Kim et al. | |

FOREIGN PATENT DOCUMENTS

| | | |
|---|---|---|
| CN | 108242217 | 7/2018 |
| KR | 10-2005-0041659 | 5/2005 |
| KR | 10-0742092 | 7/2007 |
| KR | 10-1163646 | 7/2012 |
| KR | 10-2016-0027332 | 3/2016 |
| KR | 10-2018-0002274 | 1/2018 |
| KR | 10-2018-0007025 | 1/2018 |
| KR | 10-2018-0007376 | 1/2018 |
| KR | 10-2018-0046491 | 5/2018 |
| KR | 10-2018-0072909 | 7/2018 |
| KR | 10-2064240 | 1/2020 |

OTHER PUBLICATIONS

Written Opinion, with English translation, corresponding to International Application No. PCT/KR2019/004526, dated Jul. 23, 2019.

* cited by examiner

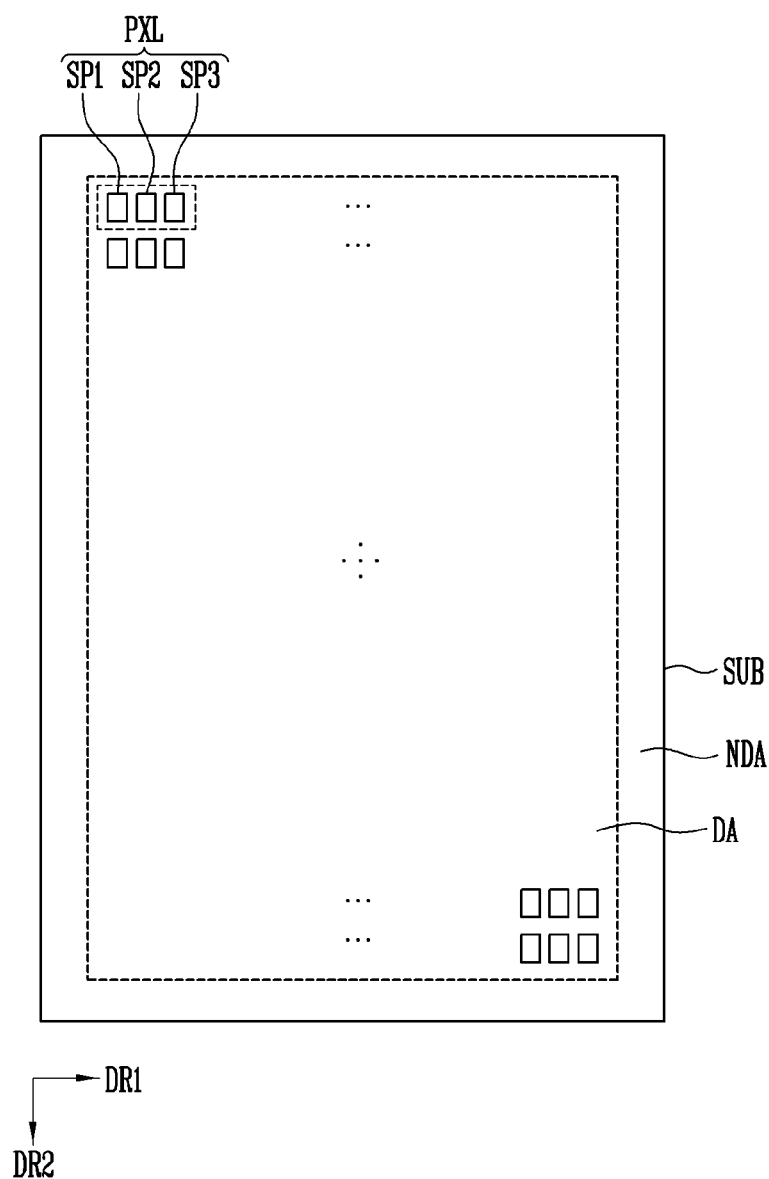

DISPLAY DEVICE

CROSS-REFERENCE TO RELATED APPLICATION(S)

This application is a national entry of International Application No. PCT/KR2019/004526, filed on Apr. 15, 2019, which claims under 35 U.S.C. § 119(a) and 365(b) priority to and benefits of Korean Patent Application No. 10-2018-0123414, filed on Oct. 16, 2018 in the Korean Intellectual Property Office, the entire contents of which are incorporated herein by reference.

BACKGROUND

1. Technical Field

Various embodiments of the disclosure relate to a display device including a subminiature light emitting element.

2. Description of the Related Art

A light emitting diode may have relatively satisfactory durability even under poor environmental conditions, and have excellent performance in terms of lifetime and luminance. Recently, research on the technology of applying such light emitting diodes to various display devices has become appreciably more active.

As a part of such research, technologies are being developed of fabricating a light emitting diode having a subminiature size corresponding to the micro-scale or the nano-scale using an inorganic crystalline structure, e.g., a structure obtained by growing a nitride-based semiconductor.

To apply the LED to a lighting device, a display device, or the like, there is a need to couple the LED to an electrode so that the voltage of the power supply may be applied to the LED. With regard to application purposes of the LED, a method of reducing space needed for the electrode, or a method of fabricating the LED, various research on arrangement relationships between the LED and the electrode have been conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Various embodiments of the disclosure are directed to a display device having enhanced light transmissivity.

A display device in accordance with an embodiment of the disclosure may include a substrate including a display area and a non-display area, and pixels disposed in the display area, each of the pixels including sub-pixels. Each of the sub-pixels may include a pixel circuit layer, and a display element layer including at least one light emitting element that emits light.

In an embodiment of the disclosure, the display element layer may include first and second electrodes disposed on a same surface and spaced apart from each other, the at least one light emitting element disposed between the first electrode and the second electrode, a first contact electrode that electrically connects an end of the at least one light emitting element to the first electrode, and a second contact electrode that electrically connects another end of the opposite ends of the at least one light emitting element to the second electrode.

In an embodiment of the disclosure, each of the sub-pixels may include a first area in which the pixel circuit layer may be disposed, and a second area adjacent to the first area. The second area may include a transmission area through which the light passes.

In an embodiment of the disclosure, a light transmissivity of the second area may be higher than a light transmissivity of the first area.

In an embodiment of the disclosure, the display element layer may be disposed in at least one of the first area and the second area.

In an embodiment of the disclosure, the display element layer may include a first capping layer disposed on the first electrode and electrically connected to the first electrode, and a second capping layer disposed on the second electrode and electrically connected to the second electrode. The first capping layer and the second capping layer may be made of transparent conductive material.

In an embodiment of the disclosure, the pixel circuit layer may include at least one transistor disposed on the substrate and electrically connected to the at least one light emitting element, a driving voltage line disposed on the substrate and extending from the first area to the second area, and a passivation layer disposed over the transistor and the driving voltage line.

In an embodiment of the disclosure, the display element layer may be disposed in each of the first area and the second area.

In an embodiment of the disclosure, the first electrode and the second electrode may extend from the first area to the second area.

In an embodiment of the disclosure, the first electrode and the second electrode may be disposed in each of the first area and the second area. The first electrode disposed in the first area and the first electrode provided in the second area may be spaced apart from each other. The second electrode disposed in the first area and the second electrode disposed in the second area may be spaced apart from each other.

In an embodiment of the disclosure, in each of the sub-pixels, the first capping layer may extend from the first area to the second area and electrically connect the first electrode of the first area to the first electrode of the second area. In each of the sub-pixels, the second capping layer may extend from the first area to the second area and electrically couple the second electrode of the first area to the second electrode of the second area.

In an embodiment of the disclosure, the display element layer may be disposed in the first area and overlap the pixel circuit layer.

In an embodiment of the disclosure, the display element layer may further include a connection line that electrically connects the driving voltage line to the second electrode.

In an embodiment, the connection line and the second capping layer may be integral with each other.

In an embodiment, the connection line and the second electrode may be integral with each other.

In an embodiment of the disclosure, the second area may include a 2-1th area in which the display element layer may be disposed, and a 2-2th area adjacent to the 2-1th area. The display element layer may not be disposed in the 2-2th area.

In an embodiment of the disclosure, an additional conductive pattern that electrically connects the driving voltage line to the second electrode and may be disposed in the second area.

The additional conductive pattern and the driving voltage line may be integral with each other, and the additional conductive pattern may be electrically connected to the second electrode through a contact hole passing through the passivation layer.

In an embodiment of the disclosure, a light shielding layer may be disposed in the first area of each of the sub-pixels. The light shielding layer may be disposed between the substrate and the transistor.

The light shielding layer may block light from a rear surface of the substrate.

In an embodiment of the disclosure, the at least one light emitting element may include a light emitting diode having a shape of a cylinder or polyprism and having a microscale or nanoscale size.

A display device in accordance with an embodiment of the disclosure may include a substrate including a display area and a non-display area, and pixels disposed in the display area, each of the pixels comprising sub-pixels. Each of the sub-pixels may include first and second areas adjacent to each other, a pixel circuit layer disposed in the first area, and a display element layer including at least one light emitting element that emits light.

In an embodiment of the disclosure, the display element layer may include: first and second electrodes disposed on each of the first and the second areas, and spaced apart from each other, the at least one light emitting element disposed between the first electrode and the second electrode in each of the first and the second areas, a capping layer disposed on each of the first and the second electrodes and extending from the first area to the second area, a first contact electrode that electrically connects an end of the at least one light emitting element to the first electrode in each of the first and the second areas, and a second contact electrode that electrically connects another end of the at least one light emitting element to the second electrode in each of the first and the second areas. The second area may include a transmission area through which the light passes.

An embodiment of the disclosure may provide a display device having enhanced light transmissivity.

The effects of the disclosure are not limited by the foregoing, and other various effects are anticipated herein.

BRIEF DESCRIPTION OF THE DRAWINGS

FIG. 2 illustrates a display device in accordance with an embodiment of the disclosure, and particularly, is a schematic plan view illustrating a display device using the light emitting element illustrated in FIG. 1A as a light emitting source.

DETAILED DESCRIPTION OF THE EMBODIMENTS

Figure 1A:
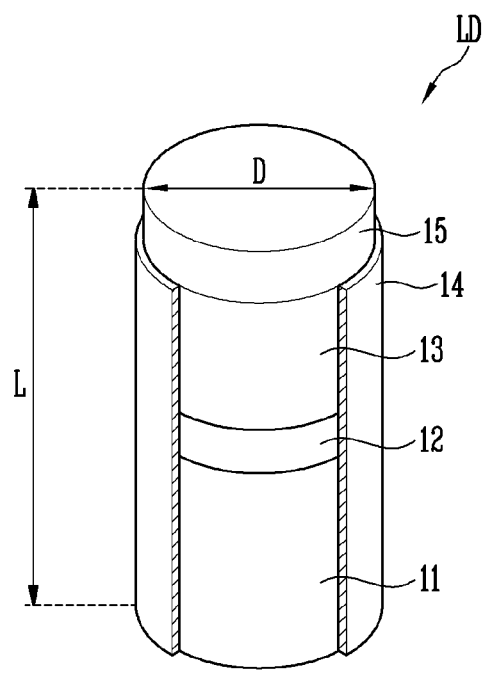
FIG. 1A is a perspective view schematically illustrating a light emitting element in accordance with an embodiment of the disclosure.

Embodiments and required details of the disclosure are described with reference to the accompanying drawings in order to describe the disclosure in detail so that those having ordinary knowledge in the technical field to which the disclosure pertains can easily practice the disclosure.

As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the spirit and technical scope of the disclosure are encompassed in the disclosure.

Throughout the disclosure, like reference numerals refer to like parts throughout the various figures and embodiments of the disclosure. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. In the disclosure, the singular forms are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations thereof, but do not preclude the presence or addition of one or more other features, integers, steps, operations, elements, components, and/or combinations thereof. Furthermore, when a first part such as a layer, a film, a region, or a plate is disposed on a second part, the first part may be not only directly on the second part but a third part may intervene between them. When it is expressed that a first part such as a layer, a film, a region, or a plate is formed on a second part, the surface of the second part on which the first part is formed is not limited to an upper surface of the second part but may include other surfaces such as a side surface or a lower surface of the second part. When a first part such as a layer, a film, a region, or a plate is under a second part, the first part may be not only directly under the second part but a third part may intervene between them.

The term "overlap" may include layer, stack, face or facing, extending over, extending under, covering or partly covering or any other suitable term as would be appreciated and understood by those of ordinary skill in the art. The phrase "at least one of" is intended to include the meaning of "at least one selected from the group of" for the purpose of its meaning and interpretation. For example, "at least one of A and B" may be understood to mean "A, B, or A and B." The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 1B:
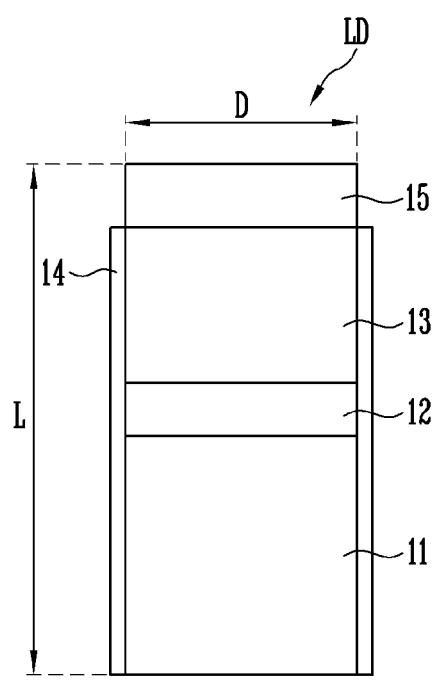
FIG. 1B is a sectional view schematically illustrating the light emitting element of FIG. 1A.
Figure 1C:
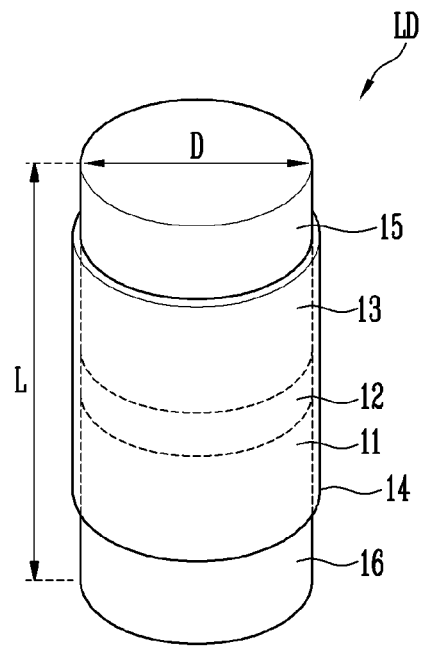
FIG. 1C is a perspective view schematically illustrating a modified embodiment of the light emitting element of FIG. 1A.
Figure 1D:
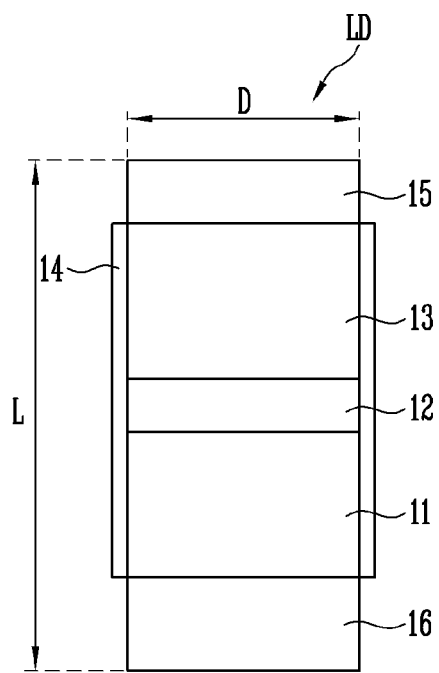
FIG. 1D is a sectional view schematically illustrating the light emitting element of FIG. 1C.

FIG. 1A is a perspective view schematically illustrating a light emitting element in accordance with an embodiment of the disclosure. FIG. 1B is a sectional view schematically illustrating the light emitting element of FIG. 1A. FIG. 1C is a perspective view schematically illustrating a modified embodiment of the light emitting element of FIG. 1A. FIG. 1D is a sectional view schematically illustrating the light emitting element of FIG. 1C.

Although FIGS. 1A to 1D illustrate cylindrical light emitting elements, the disclosure is not limited thereto.

Referring to FIGS. 1A to 1D, a light emitting element LD in accordance with an embodiment of the disclosure may include a first semiconductor layer (or a first conductive semiconductor layer) 11, a second semiconductor layer (or a second conductive semiconductor layer) 13, and an active layer 12 disposed (e.g., interposed) between the first and second conductive semiconductor layers 11 and 13. For example, the light emitting element LD may be implemented as a stacked body formed by successively stacking the first conductive semiconductor layer 11, the active layer 12, and the second conductive semiconductor layer 13.

In an embodiment of the disclosure, the light emitting element LD may be formed in a rod-like shape extending in a direction. If the direction in which the light emitting element LD extends is defined as a longitudinal direction, the light emitting element LD may have a first end and a second end in the extension direction. One of the first and second conductive semiconductor layers 11 and 13 may be disposed on the first end, and another of the first and second conductive semiconductor layers 11 and 13 may be disposed on the second end.

Although the light emitting element LD may be disposed (e.g., provided) in the form of a cylinder, the disclosure is not limited thereto. The light emitting element LD may include a rod-like shape or a bar-like shape extending in the longitudinal direction (e.g., to have an aspect ratio greater than 1). For example, the length L of the light emitting element LD in a longitudinal direction may be greater than a diameter D thereof (or a width of the cross-section thereof). The light emitting element LD may include a light emitting diode fabricated to have a small size, e.g., with a length L and/or a diameter D corresponding to the microscale or the nanoscale.

However, the size of the light emitting element LD is not limited thereto, and the size of the light emitting element LD may be changed to meet requirements of a lighting device or a self-emissive display device to which the light emitting element LD may be applied.

The first conductive semiconductor layer 11 may include, for example, at least one n-type semiconductor layer. For instance, the first conductive semiconductor layer 11 may include a semiconductor layer which includes any one or more semiconductor material of InAlGaN, GaN, AlGaN, InGaN, AlN, and InN, and may be doped with a first conductive dopant such as Si, Ge, or Sn, or a combination thereof. The material forming the first conductive semiconductor layer 11 is not limited thereto, and the first conductive semiconductor layer 11 may be formed of various other materials.

The active layer 12 may be formed on the first conductive semiconductor layer 11 and have a single or multiple quantum well structure. In an embodiment of the disclosure, a cladding layer (not illustrated) doped with a conductive dopant may be formed on and/or under the active layer 12. For example, the cladding layer may be formed of an AlGaN layer, an InAlGaN layer, or a combination thereof. Material such as AlGaN, AlInGaN, or a combination thereof may be employed to form the active layer 12.

If an electric field having a voltage or more is applied to the opposite ends of the light emitting element LD, the light emitting element LD may emit light by recombination of electron-hole pairs in the active layer 12.

The second conductive semiconductor layer 13 may be provided on the active layer 12 and include a semiconductor layer of a type different from that of the first conductive semiconductor layer 11. For example, the second conductive semiconductor layer 13 may include at least one p-type semiconductor layer. For instance, the second conductive semiconductor layer 13 may include a semiconductor layer which includes any one or more semiconductor material of InAlGaN, GaN, AlGaN, InGaN, AlN, and InN, and may be doped with a second conductive dopant such as Mg. The material forming the second conductive semiconductor layer 13 is not limited thereto, and the second conductive semiconductor layer 13 may be formed of various other materials.

In an embodiment of the disclosure, the light emitting element LD may further include an electrode layer 15 disposed on the second conductive semiconductor layer 13, as illustrated in FIGS. 1A and 1B, in addition to the first conductive semiconductor layer 11, the active layer 12, and the second conductive semiconductor layer 13. Furthermore, in an embodiment, as shown in FIGS. 1C and 1D, the light emitting element LD may further include another electrode layer 16 disposed on an end of the first conductive semiconductor layer 11 in addition to the electrode layer 15.

Although each of the electrode layers 15 and 16 may be formed of an ohmic contact electrode, the disclosure is not limited thereto. The electrode layers 15 and 16 may include metal or a metal oxide. For example, chrome (Cr), titanium (Ti), aluminum (Al), gold (Au), nickel (Ni), ITO, and an oxide or alloy thereof may be used alone or in combination with each other. However, the disclosure is not limited thereto.

Materials included in the respective electrode layers 15 and 16 may be equal to or different from each other. The electrode layers 15 and 16 may be substantially transparent or semitransparent. Therefore, light generated from the light emitting element LD may pass through the electrode layers 15 and 16 and be emitted outside the light emitting element LD.

In an embodiment of the disclosure, the light emitting element LD may further include an insulating film 14. However, in some embodiments of the disclosure, the insulating film 14 may be omitted, or may be provided to cover only some of the first conductive semiconductor layer 11, the active layer 12, and the second conductive semiconductor layer 13.

As illustrated in FIGS. 1A and 1B, the insulating film 14 may be provided on a portion of the light emitting element LD other than an end of opposite ends of the light emitting element LD. The insulating film 14 may expose only the electrode layer 15 disposed on an end of the second conductive semiconductor layer 13 of the light emitting element LD and enclose the overall side surfaces of the components other than the electrode layer 15. Here, the insulating film 14 may allow at least the opposite ends of the light emitting element LD to be exposed to the outside. For example, the insulating film 14 may allow not only the electrode layer 15 disposed on an end of the second conductive semiconductor layer 13 but also an end of the first conductive semiconductor layer 11 to be exposed to the outside.

In an embodiment, as illustrated in FIGS. 1C and 1D, in the case where the electrode layers 15 and 16 are disposed on the respective opposite ends of the light emitting element LD, the insulating film 14 may allow an area of each of the electrode layers 15 and 16 to be exposed to the outside. In another embodiment, the insulating film 14 may not be provided.

In an embodiment of the disclosure, the insulating film 14 may include transparent insulating material. For example, the insulating film 14 may include at least one insulating material selected from the group of $SiO_2$, $Si_3N_4$, $Al_2O_3$, and $TiO_2$, but the disclosure is not limited thereto. In other words, various materials having insulating properties may be employed.

If the insulating film 14 is provided on the light emitting element LD, the active layer 12 may be prevented from short-circuiting with a first electrode and/or a second electrode (not illustrated). Thanks to the insulating film 14, occurrence of a defect on the surface of the light emitting element LD may be minimized, whereby the lifetime and efficiency of the light emitting element LD may be improved. In the case where light emitting elements LD are disposed in close contact with each other, the insulating film 14 may prevent an undesired short-circuit from occurring between the light emitting elements LD.

The light emitting element LD may be employed as a light source for various display devices. The light emitting element LD may be fabricated through a surface treatment process.

FIG. 2 illustrates a display device in accordance with an embodiment of the disclosure, and particularly, is a schematic plan view illustrating a display device using the light emitting element illustrated in FIG. 1A as a light emitting source.

For the sake of explanation, FIG. 2 schematically illustrates the structure of the display device, focused on a display area on which an image may be displayed. In some embodiments, although not illustrated, at least one driving circuit (e.g., a scan driver and a data driver) and/or lines may be further provided in the display device.

Referring to FIGS. 1A and 2, the display device in accordance with the embodiment of the disclosure may include a substrate SUB, pixels PXL provided on the substrate SUB and each including at least one light emitting element LD, a driver (not illustrated) provided on the substrate SUB and that drives the pixels PXL, and a line component (not illustrated) provided to connect the pixels PXL with the driver.

The display device may be classified as a passive-matrix type display device and an active-matrix type display device according to a driving method. For example, in the case where the display device in accordance with an embodiment is implemented as an active matrix type, each of the pixels PXL may include a driving transistor that controls the amount of current to be supplied to the light emitting element LD, and a switching transistor that transmits data signals to the driving transistor.

Recently, active-matrix type display devices capable of selectively turning on each pixel PXL taking into account the resolution, the contrast, and the working speed have been mainstreamed. However, the disclosure is not limited thereto. For example, passive-matrix type display devices in which pixels PXL may be turned on by groups may also employ components (e.g., first and second electrodes) for driving the light emitting element LD.

The substrate SUB may include a display area DA and a non-display area NDA.

In an embodiment, the display area DA may be disposed in a central area of the display device, and the non-display area NDA may be disposed in a perimeter area of the display device in such a way as to enclose the display area DA. The locations of the display area DA and the non-display area NDA are not limited thereto, and the locations thereof may be changed.

The display area DA may be an area in which the pixels PXL for displaying an image may be provided. The non-display area NDA may be an area in which the driver for driving the pixels PXL and some of the line component for coupling the pixels PXL to the driver may be provided.

The display area DA may have various shapes. For example, the display area DA may be provided in various forms such as a closed polygon including sides formed of linear lines, a circle, an ellipse or the like including a side formed of a curved line, and a semicircle, a semi-ellipse or the like including sides formed of a linear line and a curved line.

The non-display area NDA may be provided in at least one side of the display area DA. In an embodiment of the disclosure, the non-display area NDA may enclose the perimeter of the display area DA.

The substrate SUB may include transparent insulating material to allow light transmission. The substrate SUB may be a rigid substrate. For example, the substrate SUB may be one of a glass substrate, a quartz substrate, a glass ceramic substrate, and a crystalline glass substrate.

The substrate SUB may be a flexible substrate. Here, the substrate SUB may be either a film substrate or a plastic substrate which includes polymer organic material. For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, materials constituting the substrate SUB may be changed, and include, for example, fiber reinforced plastic (FRP).

The pixels PXL may be disposed in the display area DA on the substrate SUB. Each of the pixels PXL may display an image, and multiple pixels PXL may be provided.

Each pixel PXL may include a light emitting element LD that may be driven in response to a corresponding scan signal and a corresponding data signal. The light emitting element LD may have a small size corresponding to the nanoscale or the microscale, and be connected in parallel to light emitting elements LD disposed adjacent thereto. The light emitting element LD may form a light source of the corresponding pixel PXL.

Furthermore, each of the pixels PXL may include sub-pixels. For example, each pixel PXL may include a first sub-pixel SP1, a second sub-pixel SP2, and a third sub-pixel SP3. In an embodiment, the first sub-pixel SP1, the second sub-pixel SP2, and the third sub-pixel SP3 may emit light of different colors. For instance, the first sub-pixel SP1 may be a red sub-pixel for emitting red light, the second sub-pixel SP2 may be a green sub-pixel for emitting green light, and the third sub-pixel SP3 may be a blue sub-pixel for emitting blue light. However, the colors, types and/or number of sub-pixels forming each pixel PXL are not particularly limited. For example, the color of light which is emitted from each sub-pixel may be changed in various ways. Although in FIG. 2 there is illustrated an embodiment where the pixels PXL may be arranged in the display area DA in a stripe shape, the disclosure is not limited thereto. For instance, the display area DA may have various well-known pixel arrangement shapes.

The driver may provide a signal to each pixel PXL through the line component and thus control the operation of the pixel PXL. In FIG. 2, the line component is omitted for the convenience sake of explanation.

The driver may include a scan driver that provides scan signals to the pixels PXL through scan lines, an emission driver that provides emission control signals to the pixels PXL through emission control lines, a data driver that provides data signals to the pixels PXL through data lines, and a timing controller. The timing controller may control the scan driver, the emission driver, and the data driver.

Figure 3A:
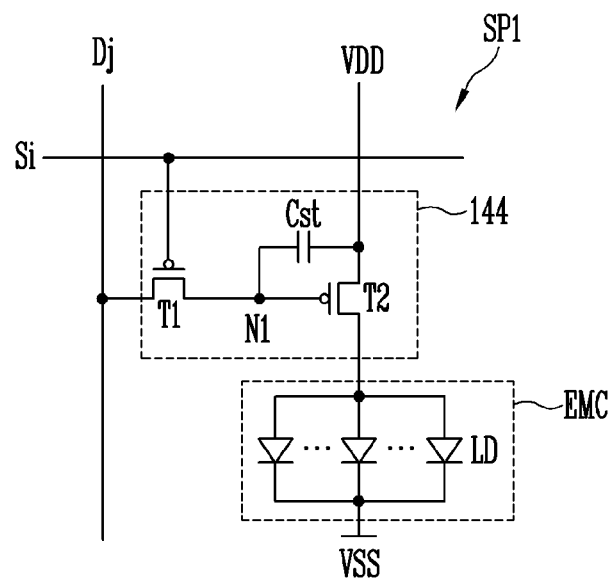
FIGS. 3A to 3C are circuit diagrams schematically illustrating examples of a unit emission area of the display device of FIG. 2 in accordance with various embodiments.
Figure 3B:
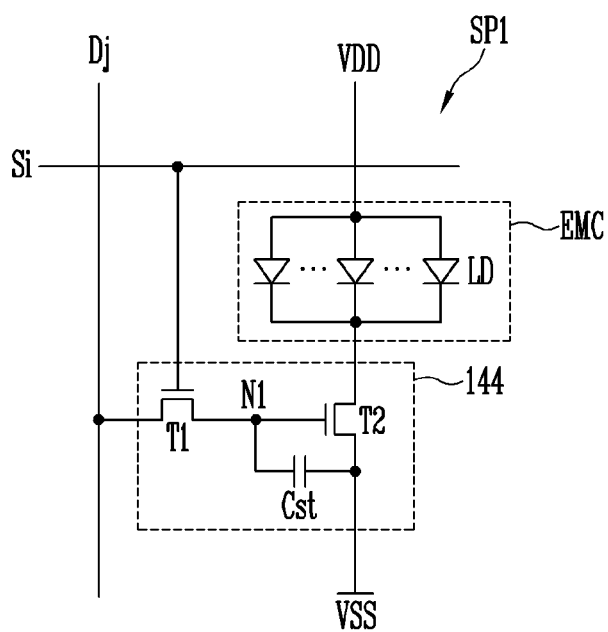
Figure 3C:
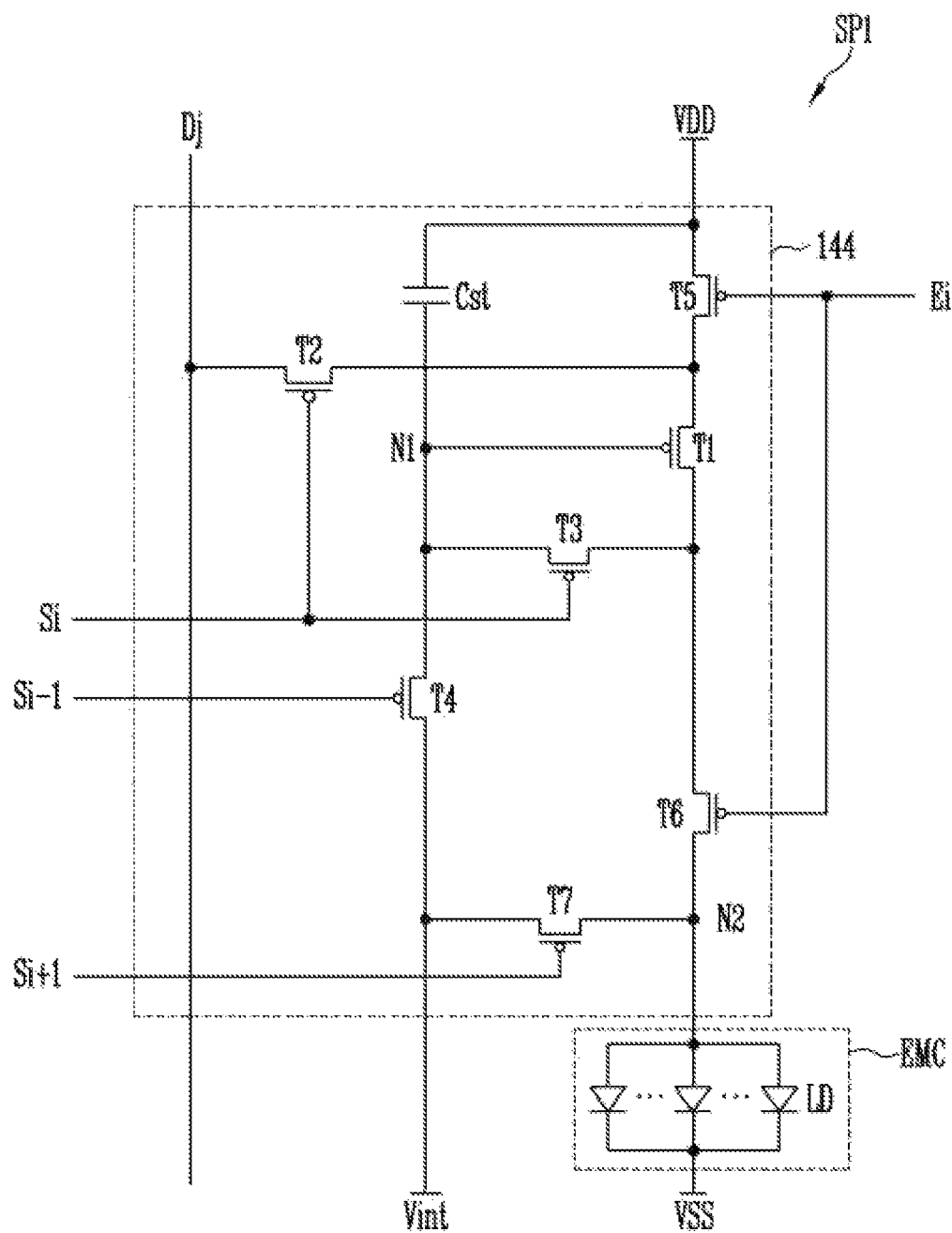

FIGS. 3A to 3C are circuit diagrams schematically illustrating examples of a unit emission area of the display device of FIG. 2 in accordance with various embodiments.

Referring to FIGS. 3A to 3C, each of the first to third sub-pixels may be configured of an active pixel. However, the type, the configuration, and/or the driving method of each of the first to third sub-pixels is not particularly limited. For example, each of the first to third sub-pixels may be configured of a pixel of a passive or active display device which can have various known structures.

Furthermore, referring to FIGS. 3A to 3C, the first to third sub-pixels may have substantially the same structure or similar structures. Hereinafter, for convenience sake, the first sub-pixel of the first to third sub-pixels will be described as a representative example.

Referring to FIGS. 1A, 2, and 3A, the first sub-pixel SP1 may include an emission circuit EMC that generates light having a luminance corresponding to a data signal, and a pixel driving circuit 144 that drives the emission circuit EMC.

In an embodiment, the emission circuit EMC may include light emitting elements LD connected parallel to each other between a first driving power supply VDD and a second driving power supply VSS. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a threshold voltage of the light emitting elements LD or more during an emission period of the first sub-pixel SP1. A first electrode (e.g., an anode electrode) of each of the light emitting elements LD may be connected to the first driving power supply VDD via the pixel driving circuit 144. A second electrode (e.g., a cathode electrode) of each of the light emitting elements LD may be connected to the second driving power supply VSS.

Each of the light emitting elements LD may emit light at a luminance corresponding to driving current which may be controlled by the pixel driving circuit 144.

Although FIGS. 3A to 3C illustrate embodiments in which the light emitting elements LD may be connected in parallel to each other in the same direction (e.g., a forward direction) between the first and second driving power supplies VDD and VSS, the disclosure is not limited thereto. For example, in an embodiment, some of the light emitting elements LD may be connected to each other in the forward direction between the first and second driving power supplies VDD and VSS, and other light emitting elements LD may be connected to each other in the reverse direction. The voltage of one of the first and second driving power supplies VDD and VSS may be supplied in the form of an AC voltage. The light emitting elements LD may alternately emit light by the same connection direction groups. In another embodiment, the first sub-pixel SP1 may include only a single light emitting element LD.

In an embodiment of the disclosure, the pixel driving circuit 144 may include first and second transistors T1 and T2, and a storage capacitor Cst. The structure of the pixel driving circuit 144 is not limited to that of the embodiment illustrated in FIG. 3A.

A first electrode of the first transistor (T1; switching transistor) may be connected to a data line Dj, and a second electrode thereof may be connected to a first node N1. Here, the first electrode and the second electrode of the first transistor T1 may be different electrodes. For example, if the first electrode is a source electrode, the second electrode may be a drain electrode. A gate electrode of the first transistor T1 may be connected to the scan line Si.

In case that a scan signal having a voltage (e.g., a low-level voltage) capable of turning on the first transistor T1 is supplied from the scan line Si, the first transistor T1 may be turned on to electrically connect the data line Dj with the first node N1. Here, a data signal of a corresponding frame may be supplied to the data line Dj, whereby the data signal may be transmitted to the first node N1. The data signal transmitted to the first node N1 may be charged to the storage capacitor Cst.

A first electrode of the second transistor (T2; driving transistor) may be connected to the first driving power supply VDD, and a second electrode thereof may be electrically connected to the first electrode of each of the light emitting elements LD. A gate electrode of the second transistor T2 may be connected to the first node N1. As such, the second transistor T2 may control the amount of driving current to be supplied to the light emitting elements LD in response to the voltage of the first node N1.

An electrode of the storage capacitor Cst may be connected to the first driving power supply VDD, and another electrode thereof may be connected to the first node N1. The storage capacitor Cst may be charged with a voltage corresponding to a data signal supplied to the first node N1, and maintain the charged voltage until a data signal of a subsequent frame may be supplied.

For the sake of explanation, FIG. 3A illustrates the pixel driving circuit 144 having a relatively simple structure including the first transistor T1 that transmits the data signal to the first sub-pixel SP1, the storage capacitor Cst that stores the data signal, and the second transistor T2 that supplies driving current corresponding to the data signal to the light emitting elements LD.

However, the disclosure is not limited thereto, and the structure of the pixel driving circuit 144 may be changed in various ways. For example, the pixel driving circuit 144 may further include at least one transistor element such as a transistor element that compensates for the threshold voltage of the second transistor T2, a transistor element that initializes the first node N1, and/or a transistor element that controls an emission time of the light emitting elements LD, or other circuit elements such as a boosting capacitor for boosting the voltage of the first node N1.

Furthermore, although in FIG. 3A the transistors, e.g., the first and second transistors T1 and T2, included in the pixel driving circuit 144 have been illustrated as being formed of P-type transistors, the disclosure is not limited thereto. In other words, at least one of the first and second transistors T1 and T2 included in the pixel driving circuit 144 may be changed to an N-type transistor.

Referring to FIGS. 1A, 2, and 3B, the first and second transistors T1 and T2 in accordance with an embodiment of the present disclosure may be formed of N-type transistors. The configuration and operation of the pixel driving circuit 144 illustrated in FIG. 3B, other than a change in connection positions of some components due to a change in the type of transistor, may be similar to those of the pixel driving circuit 144 of FIG. 3A. Therefore, detailed descriptions pertaining thereto will be omitted.

In an embodiment of the disclosure, the configuration of the pixel driving circuit 144 is not limited to the embodiments illustrated in FIGS. 3A and 3B. For example, the pixel driving circuit 144 may be configured in the same manner as that of an embodiment illustrated in FIG. 3C.

Referring to FIGS. 1A, 2, and 3C, the pixel driving circuit 144 may be connected to the scan line Si and the data line Dj of the first sub-pixel SP1. For example, if the first sub-pixel SP1 is disposed on an ith row and a jth column of the display area DA, the pixel driving circuit 144 of the first sub-pixel SP1 may be connected to an ith scan line Si and a jth data line Dj of the display area DA.

In an embodiment, the pixel driving circuit 144 may also be connected to at least one scan line. For example, the first sub-pixel SP1 disposed on the ith row of the display area DA may be further connected to an i−1th scan line Si−1 and/or an i+1th scan line Si+1.

In an embodiment, the pixel driving circuit 144 may be connected not only to the first and second driving power supplies VDD and VSS but also to a third power supply. For example, the pixel driving circuit 144 may also be connected to an initialization power supply Vint.

The pixel driving circuit 144 may include first to seventh transistors T1 to T7, and a storage capacitor Cst.

A first electrode of the first transistor (T1; driving transistor), e.g., a source electrode, may be connected to the first driving power supply VDD via the fifth transistor T5, and a second electrode thereof, e.g., a drain electrode, may be connected to ends of light emitting elements LD via the sixth transistor T6. A gate electrode of the first transistor T1 may be connected to a first node N1. The first transistor T1 may control driving current flowing between the first driving power supply VDD and the second driving power supply VSS via the light emitting elements LD in response to the voltage of the first node N1.

The second transistor (T2; switching transistor) may be connected between the jth data line Dj connected to the first sub-pixel SP1 and the source electrode of the first transistor T1. A gate electrode of the second transistor T2 may be connected to the ith scan line Si connected to the first sub-pixel SP1. In case that a scan signal having a gate-on voltage (e.g., a low-level voltage) is supplied from the ith scan line Si, the second transistor T2 may be turned on to electrically connect the jth data line Dj to the source electrode of the first transistor T1. Hence, if the second transistor T2 is turned on, a data signal supplied from the jth data line Dj may be transmitted to the first transistor T1.

The third transistor T3 may be connected between the drain electrode of the first transistor T1 and the first node N1. A gate electrode of the third transistor T3 may be connected to the ith scan line Si. In case that a scan signal having a gate-on voltage is supplied from the scan line Si, the third transistor T3 may be turned on to electrically connect the drain electrode of the first transistor T1 to the first node N1. Therefore, in case that the third transistor T3 is turned on, the first transistor T1 may be connected in the form of a diode.

The fourth transistor T4 may be connected between the first node N1 and an initialization power supply Vint. A gate electrode of the fourth transistor T4 may be connected to a preceding scan line, e.g., an i−1th scan line Si−1. In case that a scan signal of a gate-on voltage is supplied to the i−1th scan line Si−1, the fourth transistor T4 may be turned on so that the voltage of the initialization power supply Vint may be transmitted to the first node N1. Here, the initialization power supply Vint may have a voltage equal to or less than the minimum voltage of the data signal.

The fifth transistor T5 may be connected between the first driving power supply VDD and the first transistor T1. A gate electrode of the fifth transistor T5 may be connected to a corresponding emission control line, e.g., an ith emission control line Ei. The fifth transistor T5 may be turned off in case that an emission control signal having a gate-off voltage may be supplied to the ith emission control line Ei, and may be turned on in other cases.

The sixth transistor T6 may be connected between the first transistor T1 and first ends of the light emitting elements LD. A gate electrode of the sixth transistor T6 may be connected to the ith emission control line Ei. The sixth transistor T6 may be turned off in case that an emission control signal having a gate-off voltage is supplied to the ith emission control line Ei, and may be turned on in other cases. A second node N2 may be disposed between the sixth transistor T6 and the light emitting elements LD.

The seventh transistor T7 may be connected between the first ends of the light emitting elements LD and the initialization power supply Vint. A gate electrode of the seventh transistor T7 may be connected to any one of scan lines of a subsequent stage, e.g., to the i+1th scan line Si+1. In case that a scan signal of a gate-on voltage is supplied to the i+1th scan line Si+1, the seventh transistor T7 may be turned on so that the voltage of the initialization power supply Vint may be supplied to the first ends of the light emitting elements LD.

The storage capacitor Cst may be connected between the first driving power supply VDD and the first node N1. The storage capacitor Cst may store a voltage corresponding both to the data signal applied to the first node N1 during each frame period and to the threshold voltage of the first transistor T1.

For convenience sake, FIG. 3C illustrates that all of the first to seventh transistors T1 to T7 may be formed of P-type transistors, but the disclosure is not limited thereto. For example, at least one of the first to seventh transistors T1 to T7 included in the pixel driving circuit 144 may be formed of an N-type transistor, or all of the first to seventh transistors T1 to T7 may be formed of N-type transistors.

Figure 4:
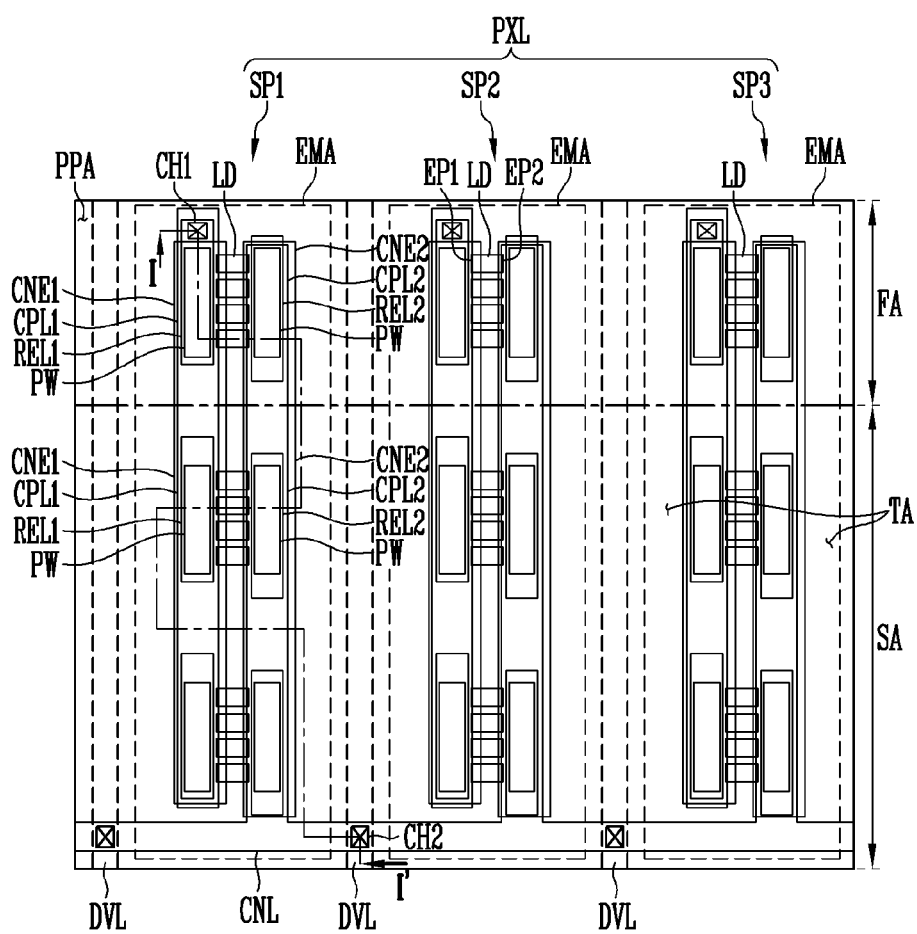
FIG. 4 is a plan view schematically illustrating first to third sub-pixels included in a pixel illustrated in FIG. 2.
Figure 5:
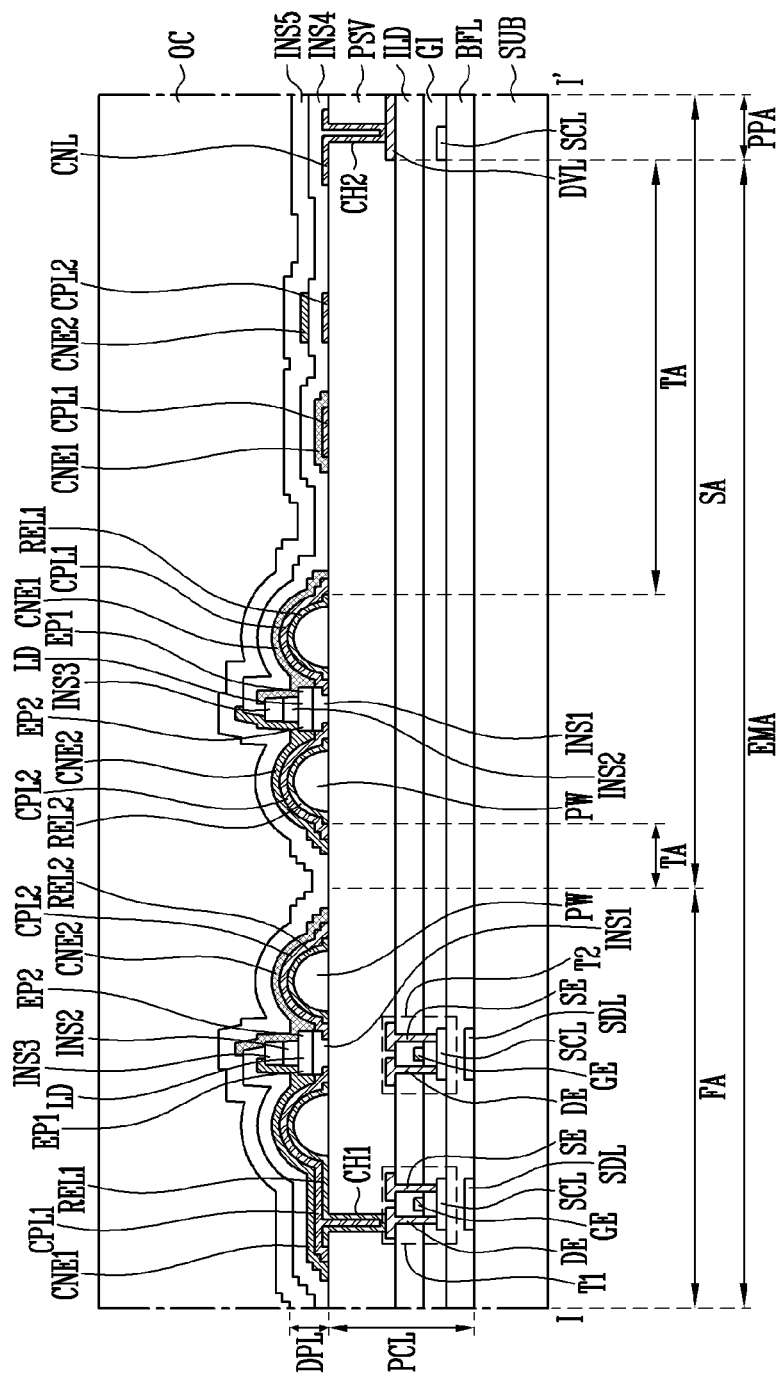
FIG. 5 is a schematic sectional view taken along line I-I' of FIG. 4.
Figure 6:
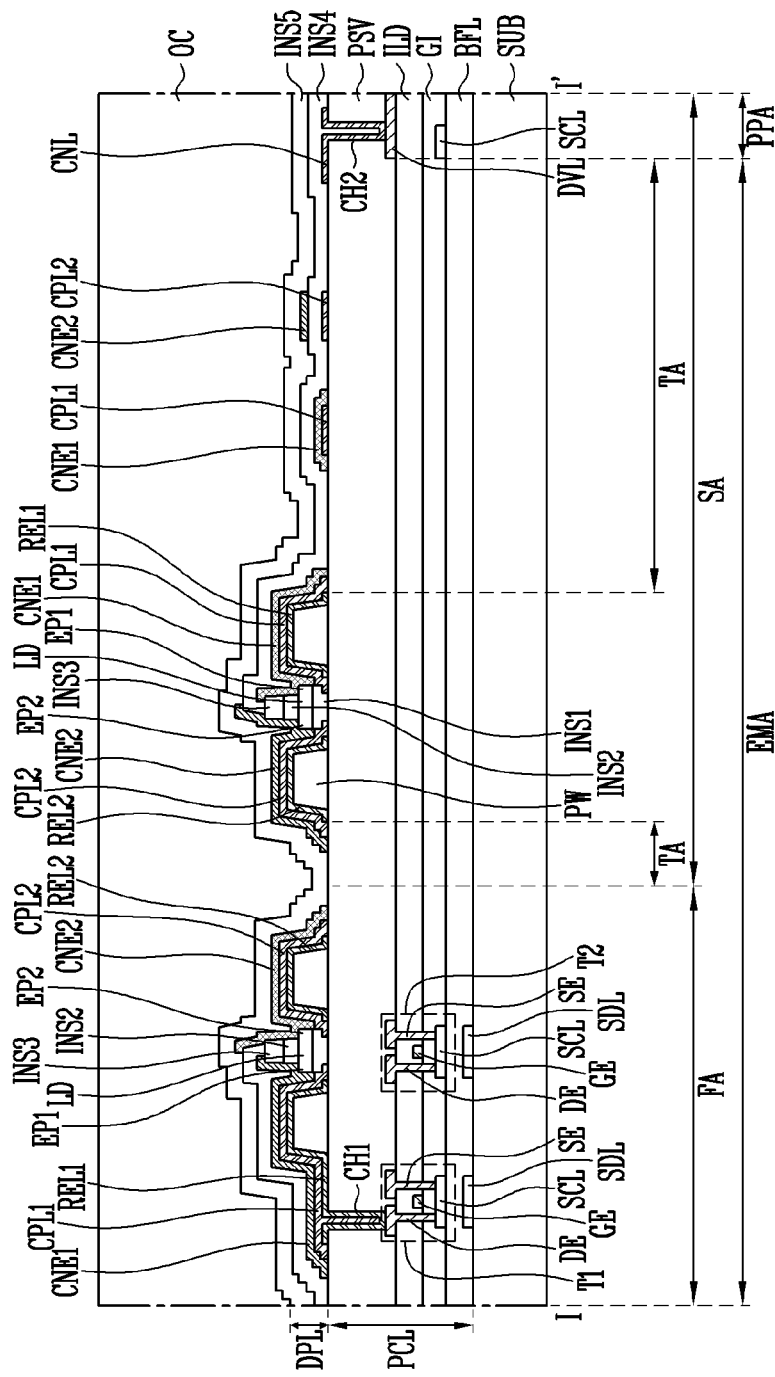
FIG. 6 illustrates another shape of a partition wall (or bank pattern) illustrated in FIG. 5, and is a schematic sectional view taken along line I-I' of FIG. 4.

FIG. 4 is a plan view schematically illustrating first to third sub-pixels included in a pixel illustrated in FIG. 2. FIG. 5 is a schematic sectional view taken along line I-I' of FIG. 4. FIG. 6 illustrates an embodiment of the partition wall shown in FIG. 5, and is a schematic sectional view corresponding to line I-I' of FIG. 4.

In FIG. 4, for the sake of explanation, light emitting elements provided in each sub-pixel are illustrated as being horizontally aligned. However, the alignment of the light emitting elements is not limited thereto. For example, at least some of the light emitting elements may be aligned in a direction intersecting with the horizontal direction.

Furthermore, for the sake of explanation, illustration of transistors connected to the light emitting elements, and signal lines connected to the transistors has been omitted in FIG. 4.

Moreover, although FIGS. 4 to 6 illustrate a simplified structure of a pixel, e.g., showing that each electrode has only a single electrode layer, the disclosure is not limited thereto.

Referring to FIGS. 1A, 2, and 4 to 6, the display device in accordance with an embodiment of the disclosure may include a substrate SUB on which pixels PXL may be provided.

Each of the pixels PXL may include a first sub-pixel SP1, a second sub-pixel SP2, and a third sub-pixel SP3 which may be provided in the substrate SUB. In an embodiment of the disclosure, the first sub-pixel SP1 may be a red sub-pixel, the second sub-pixel SP2 may be a green sub-pixel, and the third sub-pixel SP3 may be a blue sub-pixel. However, the disclosure is not limited thereto. In an embodiment, the first sub-pixel SP1 may be a green sub-pixel or a blue sub-pixel, the second sub-pixel SP2 may be a blue sub-pixel or a red sub-pixel, and the third sub-pixel SP3 may be a red sub-pixel or a green sub-pixel.

Each of the first to third sub-pixels SP1, SP2, and SP3 may include an emission area EMA which emits light, and a peripheral area PPA disposed around a perimeter of the emission area EMA. The emission area EMA may refer to an area from which light may be emitted, and the peripheral area PPA may refer to an area from which the light may not be emitted. In an embodiment of the present disclosure, a pixel region of each of the first to third sub-pixels SP1, SP2, and SP3 may include the emission area EMA and the peripheral area PPA of the corresponding sub-pixel.

A substrate SUB, a pixel circuit layer PCL, and a display element layer DPL may be provided in the pixel area of each of the first to third sub-pixel SP1, SP2, and SP3.

In an embodiment of the disclosure, each of the first to third sub-pixels SP1, SP2, and SP3 may include a first area FA and a second area SA. The first area FA may be an area in which the pixel circuit layer PCL may be disposed, and the second area SA may be an area adjacent to the first area FA. In other words, the second area SA may be an area in each sub-pixel other than the first area FA, and be an area in which the pixel circuit layer PCL may not be disposed.

The pixel circuit layer PCL of each of the first to third sub-pixels SP1, SP2, and SP3 may be disposed in a specific area of the corresponding sub-pixel, e.g., in only the first area FA. In the case where the pixel circuit layer PCL of each of the first to third sub-pixels SP1, SP2, and SP3 may be intensively disposed in only the first area FA of the corresponding sub-pixel and may be not disposed in the second area SA, the aperture ratio of the corresponding sub-pixel may be enhanced, and the light transmissivity may also be increased.

In an embodiment of the disclosure, the surface area (or the size) of the first area FA of each of the first to third sub-pixels SP1, SP2, and SP3 may be determined within a range in which the degree of integration of components (e.g., including a transistor and a line connected to the transistor) included in the pixel circuit layer PCL of the corresponding sub-pixel and electrical insulation between adjacent components can be secured.

In an embodiment of the disclosure, the first area FA of each of the first to third sub-pixels SP1, SP2, and SP3 may be provided in the emission area EMA of the corresponding sub-pixel, but the disclosure is not limited thereto. In an embodiment, the first area FA of each of the first to third sub-pixels SP1, SP2, and SP3 may be provided in the peripheral area PPA of the corresponding sub-pixel. The first area FA of each of the first to third sub-pixels SP1, SP2, and SP3 may not be provided with the display element layer DPL of the corresponding sub-pixel.

For the sake of explanation, the pixel circuit layer PCL of each of the first to third sub-pixels SP1, SP2, and SP3 will be described, and the display element layer DPL will be described.

The pixel circuit layer PCL of each of the first to third sub-pixels SP1, SP2, and SP3 may be disposed in the first area FA of the corresponding sub-pixel.

The pixel circuit layer PCL of each of the first to third sub-pixels SP1, SP2, and SP3 may include a buffer layer BFL disposed on the substrate SUB, first and second transistors T1 and T2 disposed on the buffer layer BFL, and a driving voltage line DVL. Furthermore, the pixel circuit layer PCL of each of the first to third sub-pixels SP1, SP2, and SP3 may further include a passivation layer PSV which may be provided over the first and second transistors T1 and T2 and the driving voltage line DVL.

The substrate SUB may be formed of transparent insulating material such as glass, an organic polymer, crystal, or a combination thereof, to allow light to pass therethrough. Furthermore, the substrate SUB may be made of material having flexibility so as to be bendable or foldable, and have a single-layer or multi-layer structure.

The buffer layer BFL may be provided on the substrate SUB and prevent impurities from diffusing into the first transistor T1 or the second transistor T2. The buffer layer BFL may be omitted depending on the material of the substrate SUB or processing conditions.

The first transistor T1 may be a driving transistor which may be electrically connected to some of the light emitting elements LD provided in the display element layer DPL of a corresponding sub-pixel to drive the light emitting elements LD. The second transistor T2 may be a switching transistor that switches the first transistor T1. In an embodiment, the first and second transistors T1 and T2 may be provided in only the first area FA of each of the first to third sub-pixels SP1, SP2, and SP3.

Each of the first and second transistors T1 and T2 may include a semiconductor layer SCL, a gate electrode GE, a source electrode SE, and a drain electrode DE.

The semiconductor layer SCL may be disposed on the buffer layer BFL. The semiconductor layer SCL may include a source area which comes into contact with the source electrode SE, and a drain area which comes into contact with the drain electrode DE. An area between the source area and the drain area may be a channel area.

The semiconductor layer SCL may be a semiconductor pattern formed of polysilicon, amorphous silicon, an oxide semiconductor, etc., or a combination thereof. The channel area may be an intrinsic semiconductor, which may be an undoped semiconductor pattern. Each of the source area and the drain area may be a semiconductor pattern doped with an impurity.

The gate electrode GE may be provided on the semiconductor layer SCL with a gate insulating layer GI interposed therebetween. The gate electrode GE may be formed of metal. The gate electrode GE may be formed of nickel, chrome, molybdenum, aluminum, titanium, copper, tungsten, or an alloy thereof. The gate electrode GE may be formed of a single layer or multiple layers using metal. For example, the gate electrode GE may have a triple-layer structure formed by successively stacking molybdenum, aluminum, and molybdenum, or a double-layer structure formed by successively stacking titanium and copper. In another embodiment, the gate electrode GE may have a single layer structure formed of an alloy of titanium and copper.

The source electrode SE and the drain electrode DE may respectively come into contact with the source area and the drain area of the semiconductor layer SCL through corresponding contact holes which pass through an interlayer insulating layer ILD and the gate insulating layer GI. Each of the source electrode SE and the drain electrode DE may be formed of nickel, chrome, molybdenum, aluminum, titanium, copper, tungsten, or an alloy thereof. The source electrode SE and the drain electrode DE each may be formed of a single layer or multiple layers using metal. For example, the source electrode SE and the drain electrode DE each may have a double-layer structure formed by successively stacking titanium and copper, or a single-layer structure formed of an alloy of titanium and copper.

In an embodiment of the disclosure, each of the first and second transistors T1 and T2 included in the pixel circuit layer PCL provided in each of the first to third sub-pixels SP1, SP2, and SP3 may be formed of an LTPS thin-film transistor, but the disclosure is not limited thereto. In some embodiments, each of the first and second transistors T1 and T2 may be formed of an oxide semiconductor thin-film transistor. Although in an embodiment of the disclosure there has been described an example in which each of the first and second transistors T1 and T2 may be a thin-film transistor having a top gate structure, the disclosure is not limited thereto. In an embodiment, the first and second transistors T1 and T2 each may be a thin-film transistor having a bottom gate structure.

The driving voltage line DVL may be provided on the interlayer insulating layer ILD, but the disclosure is not limited thereto. In some embodiments, the driving voltage line DVL may be provided on any one of insulating layers included in the pixel circuit layer PCL. The second driving power supply (VSS of FIG. 3A) may be applied to the driving voltage line DVL.

The passivation layer PSV may include a first contact hole CH1 which exposes a portion of the drain electrode DE of the first transistor T1, and a second contact hole CH2 which exposes a portion of the driving voltage line DVL. The passivation layer PSV may include at least one of an inorganic insulating layer formed of inorganic material, and an organic insulating layer formed of organic material. In an embodiment, the passivation layer PSV may include an inorganic insulating layer provided to cover the first and second transistors T1 and T2, and an organic insulating layer disposed on the inorganic insulating layer. The inorganic insulating layer may include at least one of silicon oxide ($SiO_x$) and silicon nitride ($SiN_x$). The organic insulating layer may include organic insulating material allowing light to pass therethrough. The organic insulating layer may include, for example, at least one of polyacrylates resin, epoxy resin, phenolic resin, polyamides resin, polyimides resin, unsaturated polyesters resin, poly-phenylen ethers resin, poly-phenylene sulfides resin, and benzocyclobutene resin.

The pixel circuit layer PCL of each of the first to third sub-pixels SP1, SP2, and SP3 may further include a light shielding pattern SDL provided between the substrate SUB and the semiconductor layer SCL.

The light shield pattern SDL may be a light shielding layer that blocks light drawn through a rear surface of the substrate SUB from traveling to the pixel circuit layer PCL of each of the first to third sub-pixels SP1, SP2, and SP3. Particularly, the light shielding pattern SDL may block light drawn through the rear surface of the substrate SUB from traveling to the semiconductor layer SCL of each of the first and second transistors T1 and T2 included in the pixel circuit layer PCL of each of the first to third sub-pixels SP1, SP2, and SP3, and thus prevent the first and second transistors T1 and T2 from malfunctioning.

The light shielding pattern SDL may be formed of conductive material, insulating material, or the like. For example, the light shielding pattern SDL may include a black matrix.

The light shielding pattern SDL may be provided on the substrate SUB to correspond to a lower portion of the semiconductor layer SCL of each of the first and second transistors T1 and T2. In an embodiment of the disclosure, the light shielding pattern SDL may be formed of metal which may be conductive material. The light shielding pattern SDL may be electrically connected to some components of each of the first and second transistors T1 and T2, but the disclosure is not limited thereto. In some embodiments, the light shielding pattern SDL may not be electrically connected to the components.

In an embodiment of the disclosure, the light shielding pattern SDL may be provided in a portion of the first area FA of each of the first to third sub-pixels SP1, SP2, and SP3 such that the light shielding pattern SDL overlaps the semiconductor layer SCL of each of the first and second transistors T1 and T2 included in the pixel circuit layer PCL, but the disclosure is not limited thereto. In some embodiments, the light shielding pattern SDL may be provided on the entirety of the first area FA of each of the first to third sub-pixels SP1, SP2, and SP3.

The display element layer DPL of each of the first to third sub-pixels SP1, SP2, and SP3 will be described.

The display element layer DPL of each of the first to third sub-pixels SP1, SP2, and SP3 may be provided in both the first area FA and the second area SA, but the disclosure is not limited thereto. In an embodiment, the display element layer DPL of each of the first to third sub-pixels SP1, SP2, and SP3 may be selectively provided in only the first area FA or only the second area SA.

In an embodiment of the disclosure, the display element layer DPL of each of the first to third sub-pixels SP1, SP2, and SP3 may include a partition wall PW, first and second electrodes REL1 and REL2, first and second capping layers CPL1 and CPL2, a connection line CNL, light emitting elements LD, and first and second contact electrodes CNE1 and CNE2 which may be provided on the passivation layer PSV.

The partition wall PW may be provided on the passivation layer PSV in the emission area EMA of each of the first to third sub-pixels SP1, SP2, and SP3. Although not illustrated, a dam layer (or a bank) formed of the same material as that of the partition wall PW may be formed and/or provided in the peripheral area PPA between adjacent sub-pixels to define the emission area EMA of each of the first to third sub-pixels SP1, SP2, and SP3.

The partition wall PW may be spaced by a distance apart from a partition wall PW disposed adjacent thereto on the passivation layer PSV. Two adjacent partition walls PW may be disposed on the passivation layer PSV and spaced apart from each other by a length L of one light emitting element LD or more. As illustrated in FIG. 5, the partition wall PW may include a cross-sectional shape having a curved surface such as a semicircle, or a semiellipse which may be reduced in width from one surface of the passivation layer PSV toward an upper end thereof, but the disclosure is not limited thereto.

In an embodiment, the partition wall PW may have a trapezoidal cross-section which may be reduced in width upward from one surface of the passivation layer PSV, as illustrated in FIG. 6. In a sectional view, the shape of each of the partition wall PW is not limited to the foregoing examples, and may be changed in various ways within a range in which the efficiency of light emitted from each of the light emitting elements LD can be enhanced. The two adjacent partition walls PW may be disposed on the same plane on the passivation layer PSV and have the same height.

Each of the first and second electrodes REL1 and REL2 may be provided in the emission area EMA of each of the first to third sub-pixels SP1, SP2, and SP3 and extend in a second direction DR2 (e.g., 'vertical direction') In an embodiment of the present disclosure, the first electrode REL1 and the second electrode REL2 may be disposed on each of the first area FA and the second area SA of the corresponding sub-pixel. The first electrode REL1 and the second electrode REL2 may be provided on the same surface and spaced apart from each other. In detail, the first electrode REL1 and the second electrode REL2 that may be disposed on the first area FA may be spaced apart from each other, and the first electrode REL1 and the second electrode REL2 that may be disposed on the second area SA may be spaced apart from each other.

The first electrode REL1 that may be disposed in the first area FA of each of the first to third sub-pixels SP1, SP2, and SP3 may be spaced apart from and electrically separated from the first electrode REL1 disposed in the second area SA of the corresponding sub-pixel. The first electrodes REL1 respectively disposed in the first and second areas FA and SA of each of the first to third sub-pixels SP1, SP2, and SP3 may be disposed in the same column, but the disclosure is not limited thereto. In an embodiment, the first electrodes REL1 respectively disposed in the first area FA and the second area SA may be disposed in different columns.

The first electrode REL1 disposed on the first area FA of each of the first to third sub-pixels SP1, SP2, and SP3 may be connected to the drain electrode DE of the first transistor T1 of the corresponding sub-pixel through the first contact hole CH1 passing through the passivation layer PSV. Hence, a signal applied to the first transistor T1 may be transmitted to the first electrode REL1 disposed in the first area FA each of the first to third sub-pixels SP1, SP2, and SP3

The first capping layer CPL1 may be provided on the first electrode REL1 of each of the first to third sub-pixels SP1, SP2, and SP3 and electrically and/or physically connected with the first electrode REL1. The first capping layer CPL1 may prevent the corresponding first electrode REL1 from being damaged by defects or the like caused during a process of fabricating the display device, and may further increase adhesive force between the first electrode REL1 and the passivation layer PSV. The first capping layer CPL1 may be formed of transparent conductive material to minimize loss of light that may be emitted from each of the light emitting elements LD and travel in a display direction of the display device. The transparent conductive material may include, e.g., ITO, IZO, ITZO, etc., or a combination thereof, but the disclosure is not limited thereto. The transparent conductive material may include any materials which minimize loss of light and have conductivity.

In an embodiment of the disclosure, the first capping layer CPL1 may have a bar shape extending from the first area FA of each of the first to third sub-pixels SP1, SP2, and SP3 to the second area SA, but the shape of the first capping layer CPL1 is not limited thereto.

Since the first capping layer CPL1 may be provided to have a shape extending from the first area FA of each of the first to third sub-pixels SP1, SP2, and SP3 to the second area SA, the first electrode REL1 of the first area FA and the first electrode REL1 of the second area SA may be electrically connected to each other by the first capping layer CPL1. Hence, in the first area FA of each of the first to third sub-pixels SP1, SP2, and SP3, a signal transmitted to the first electrode REL1 may be applied to the first electrode REL1 disposed in the second area SA through the first capping layer CPL1.

The second electrode REL2 of the first area FA of each of the first to third sub-pixels SP1, SP2, and SP3 may be spaced apart from and electrically separated from the second electrode REL2 of the second area SA of the corresponding sub-pixel. The second electrode REL2 of the first area FA of each of the first to third sub-pixels SP1, SP2, and SP3 and the second electrode REL2 of the second area SA of the corresponding sub-pixel may be disposed on the same column, but the disclosure is not limited thereto. In an embodiment, the second electrode REL2 of the first area FA of each of the first to third sub-pixels SP1, SP2, and SP3 and the second electrode REL2 of the second area SA of the corresponding sub-pixel may be disposed on different columns.

The second capping layer CPL2 may be provided on the second electrode REL2 of each of the first to third sub-pixels SP1, SP2, and SP3 and electrically and/or physically connected with the second electrode REL2. In an embodiment of the disclosure, the second capping layer CPL2 may have a bar shape extending from the first area FA of each of the first to third sub-pixels SP1, SP2, and SP3 to the second area SA, but the shape of the second capping layer CPL2 is not limited thereto.

The second capping layer CPL2 may be provided on the same layer as that of the first capping layer CPL1. The second capping layer CPL2 may include the same material as that of the first capping layer CPL1, and for example, include transparent conductive material.

Since the second capping layer CPL2 may be provided to have a shape extending from the first area FA of each of the first to third sub-pixels SP1, SP2, and SP3 to the second area SA, the second electrode REL2 disposed in the first area FA and the second electrode REL2 disposed in the second area SA may be electrically connected to each other by the second capping layer CPL2.

The connection line CNL may extend in a first direction DR1 (e.g., 'horizontal direction') intersecting with the second direction DR2. The connection line CNL may be disposed in the second area SA of each of the first to third sub-pixels SP1, SP2, and SP3, but the disclosure is not limited thereto. In an embodiment, the connection line CNL may be disposed in the first area FA of the corresponding sub-pixel. The connection line CNL may be provided in common to the first to third sub-pixels SP1, SP2, and SP3. Therefore, the first to third sub-pixels SP1, SP2, and SP3 may be connected in common to the connection line CNL.

In an embodiment of the disclosure, the connection line CNL may be provided on the same layer as that of the second capping layer CPL2, and include the same material as that of the second capping layer CPL2. In detail, the connection line CNL and the second capping layer CPL2 may be integrally provided and electrically and/or physically connected to each other. In the case where the second capping layer CPL2 and the connection line CNL may be integrally formed and/or provided, the connection line CNL may be regarded as one area of the second capping layer CPL2.

The connection line CNL may be connected to the driving voltage line DVL disposed in the peripheral area PPA of each of the first to third sub-pixels SP1, SP2, and SP3 through the second contact hole CH2 passing through the passivation layer PSV. Hence, the voltage of the second driving power supply VSS that may be applied to the driving voltage line DVL may be transmitted to the connection line CNL.

As described above, in the case where the connection line CNL and the second capping layer CPL2 are provided integrally with each other, the voltage of the second driving power supply VSS that may be applied to the connection line CNL may be transmitted to the second capping layer CPL2. Furthermore, since the second capping layer CPL2 may be provided in a shape extending from the first area FA of each sub-pixel to the second area SA and electrically and/or physically connected with the second electrode REL2 disposed in each area, the voltage of the second driving power supply VSS that may be applied to the second capping layer CPL2 may be transmitted to the second electrode REL2 of each of the first and second areas FA and SA of each sub-pixel.

In an embodiment of the disclosure, the first electrode REL1 and the second electrode REL2 may function as alignment electrodes for aligning the light emitting elements LD in the emission area EMA of each of the first to third sub-pixels SP1, SP2, and SP3.

Before the light emitting elements LD may be aligned in the emission area EMA of each of the first to third sub-pixels SP1, SP2, and SP3, a first alignment voltage may be applied to the first electrode REL1 through an alignment line (not illustrated), and a second alignment voltage may be applied to the second electrode REL2 through the connection line CNL. The first alignment voltage and the second alignment voltage may have different voltage levels.

As alignment voltages having different voltage levels may be respectively applied to the first electrode REL1 and the second electrode REL2, an electric field may be formed between the first electrode REL1 and the second electrode REL2. Hence, the light emitting elements LD may be aligned between the first electrode REL1 and the second electrode REL2. In other words, light emitting elements LD may be aligned between the first electrode REL1 and the second electrode REL2 in the first area FA of each of the first to third sub-pixels SP1, SP2, and SP3, and light emitting elements LD may be aligned between the first electrode REL1 and the second electrode REL2 in the second area SA of the corresponding sub-pixel.

After the light emitting elements LD may be aligned in the emission area EMA of each of the first to third sub-pixels SP1, SP2, and SP3, the first electrode REL1 and the second electrode REL2 may function as driving electrodes for driving the light emitting elements LD.

The first electrode REL1 and the second electrode REL2 may be made of material having a reflectivity to allow light emitted from the opposite ends EP1 and EP2 of each of the light emitting elements LD to be reflected (or to travel) in the display direction of the display device. The first electrode REL1 and the second electrode REL2 may be made of conductive material having a reflectivity. The conductive material may include metal such as Ag, Mg, Al, Pt, Pd, Au, Ni, Nd, Ir, Cr, or an alloy thereof, a conductive oxide such as an indium tin oxide (ITO), an indium zinc oxide (IZO), a zinc oxide (ZnO), or an indium tin zinc oxide (ITZO), and a conductive polymer such as PEDOT. The material of the first electrode REL1 and the second electrode REL2 is not limited to the above-mentioned materials.

Each of the first electrode REL1 and the second electrode REL2 may have a single layer structure, but the disclosure is not limited thereto, for example, it may have a multi-layer structure formed by stacking two or more materials of metals, alloys, conductive oxides, and conductive polymers.

The first electrode REL1 and the second electrode REL2 each may have a multi-layer structure including at least double layers to minimize voltage drop due to a signal delay in case that signals may be transmitted to the opposite ends EP1 and EP2 of each of the light emitting elements LD.

Since the first electrode REL1 and the second electrode REL2 each have a shape corresponding to the shape of the partition wall PW, light emitted from the opposite ends EP1 and EP2 of each of the light emitting elements LD may be reflected by the first electrode REL1 and the second electrode REL2 and more effectively travel in the display direction of the display device. Consequently, the efficiency of light emitted from the light emitting elements LD may be enhanced.

In an embodiment of the disclosure, the partition wall PW, the first electrode REL1, and the second electrode REL2 may function as reflective components enabling light emitted from each of the light emitting elements LD to travel in the display direction of the display device, thus enhancing the light output efficiency of the light emitting elements LD.

Any one of the first electrode REL1 and the second electrode REL2 may be an anode electrode, and another may be a cathode electrode. In an embodiment of the disclosure, the first electrode REL1 may be an anode electrode, and the second electrode REL2 may be a cathode electrode.

Each of the light emitting elements LD may be formed of a light emitting diode which may be made of material having an inorganic crystal structure and have a subminiature size, e.g., corresponding to the nanoscale or the microscale. The light emitting elements LD may be aligned between the first electrode REL1 and the second electrode REL2 in each of the first to third sub-pixels SP1, SP2, and SP3. In detail, the light emitting elements LD may be provided in the first area FA and the second area SA of each of the first to third sub-pixels SP1, SP2, and SP3.

Although at least two or tens of light emitting elements LD may be provided in the emission area EMA of each of the first to third sub-pixels SP1, SP2, and SP3, the disclosure is not limited thereto. In an embodiment, the number of light emitting elements LD provided in each sub-pixel may be changed in various ways.

Each of the light emitting elements LD may include a stacked body (or a stacked pattern) formed by successively stacking a first conductive semiconductor layer 11, an active layer 12, a second conductive semiconductor layer 13, and an electrode layer 15 in the longitudinal direction (L) of each light emitting element LD. Furthermore, each of the light emitting elements LD may further include an insulating film 14 which encloses an outer circumferential surface of the stacked body.

In an embodiment of the disclosure, each of the light emitting elements LD may have a cylindrical shape. Each light emitting element LD may have a first end EP1 corresponding to any one of a lower portion of the cylinder and an upper portion of the cylinder, and a second end EP2 corresponding to another of the lower portion of the cylinder and the upper portion of the cylinder. Any of the first conductive semiconductor layer 11 and the second conductive semiconductor layer 13 may be disposed on the first end EP1 of each light emitting element LD, and another of the first conductive semiconductor layer 11 and the second conductive semiconductor layer 13 may be disposed on the second end EP2 thereof.

In an embodiment of the disclosure, each of the light emitting elements LD may emit any one light of color light and/or white light.

A second insulating layer INS2 for covering a portion of an upper surface of each of the light emitting elements LD may be provided on the light emitting elements LD. Hence, the opposite ends EP1 and EP2 of each of the light emitting elements LD may be exposed to the outside. The second insulating layer INS2 may include an inorganic insulating layer formed of inorganic material, and fasten each of the light emitting elements LD aligned in the emission area EMA of each of the first to third sub-pixels SP1, SP2, and SP3.

The third insulating layer INS3 may be provided on the second insulating layer INS2. The third insulating layer INS3 may be provided on the second insulating layer INS2 and cover the second insulating layer INS2 while allowing the opposite ends EP1 and EP2 of each of the light emitting elements LD to be exposed to the outside. In an embodiment, the third insulating layer INS3 may include an organic insulating layer formed of organic material, and maintain the shape of the light emitting elements LD.

A first insulating layer INS1 may be provided under each of the light emitting elements LD. The first insulating layer INS1 may be charged into space between the passivation layer PSV and each of the light emitting elements LD to stably support the light emitting elements LD and prevent the light emitting elements LD from being removed from the passivation layer PSV. The first insulating layer INS1 may be formed of an inorganic insulating layer including inorganic material, or an organic insulating layer including organic material. Although in an embodiment of the disclosure the first insulating layer INS1 may be formed of inorganic insulating layer having an advantage in protecting the light emitting elements LD from the pixel circuit layer PCL, the disclosure is not limited thereto. In an embodiment, the first insulating layer INS1 may be formed of an organic insulating layer that has an advantage in planarization of support surfaces of the light emitting elements LD.

The first electrode REL1 disposed in the first area FA of each of the first to third sub-pixels SP1, SP2, and SP3 and the first electrode REL1 disposed in the second area SA of the corresponding sub-pixel may be disposed adjacent to an end of the opposite ends EP1 and EP2 of each of the light emitting elements LD, and be electrically connected to each of the light emitting elements LD through a first contact electrode CNE1.

As described above, the first electrode REL1 disposed in the first area FA of each of the first to third sub-pixels SP1, SP2, and SP3 and the first electrode REL1 disposed in the second area SA may be electrically and/or physically connected to each other through the first capping layer CPL1. Hence, a signal of the first transistor T1 that may be applied to the first electrode REL1 disposed in the first area FA of each of the first to third sub-pixels SP1, SP2, and SP3 may be transmitted to each of the light emitting elements LD disposed in the first and second areas FA and SA of the corresponding sub-pixel through the first capping layer CPL1 and the first contact electrode CNE1.

The second electrode REL2 disposed in the first area FA and the second area SA of each of the first to third sub-pixels SP1, SP2, and SP3 may be disposed adjacent to another end of the opposite ends EP1 and EP2 of each of the light emitting elements LD, and be electrically connected to each of the light emitting elements LD through a second contact electrode CNE2.

As described above, the second electrodes REL2 disposed in the first area FA and the second area SA of each of the first to third sub-pixels SP1, SP2, and SP3 may be electrically and/or physically connected to each other through the second capping layer CPL2. Hence, the voltage of the second driving power supply VSS that may be applied to the second capping layer CPL2 of each of the first to third sub-pixels SP1, SP2, and SP3 may be transmitted to each of the light emitting elements LD disposed in the first and second areas FA and SA of the corresponding sub-pixel through the second electrode REL2 and the second contact electrode CNE2.

The first contact electrode CNE1 may be provided on the first electrode REL1 to electrically and/or physically reliably connect the first electrode REL1 with an end of the opposite ends EP1 and EP2 of each of the light emitting elements LD.

The first contact electrode CNE1 may be formed of transparent conductive material to allow light emitted from each of the light emitting elements LD and reflected by the first electrode REL1 in the display direction of the display device to travel in the display direction without loss. The first contact electrode CNE1 may cover the first electrode REL1 and overlap the first electrode REL1. Furthermore, the first contact electrode CNE1 may cover an end of the opposite ends EP1 and EP2 of each of the light emitting elements LD, and overlap the one end.

In an embodiment of the disclosure, the first contact electrode CNE1 may be provided in the form of a bar extending from the first area FA of each sub-pixel to the second area SA, but the disclosure is not limited thereto. In an embodiment, the first contact electrode CNE1 may be divided into the first area FA and the second area SA of each of the first to third sub-pixels SP1, SP2, and SP3 and provided in a shape to cover the corresponding first electrodes REL1.

In the case where the first contact electrode CNE1 is provided in a shape extending from the first area FA of each of the first to third sub-pixels SP1, SP2, and SP3 to the second area SA, the first contact electrode CNE1 may overlap the first capping layer CPL1.

A fourth insulating layer INS4 for covering the first contact electrode CNE1 may be provided on the first contact electrode CNE1. The fourth insulating layer INS4 may prevent the first contact electrode CNE1 from being exposed to the outside, thus preventing the first contact electrode CNE1 from being corroded.

The fourth insulating layer INS4 may include an inorganic insulating layer made of inorganic material, or an organic insulating layer made of organic material. Although the fourth insulating layer INS4 may have a single layer structure as shown in the drawing, the disclosure is not limited thereto. In an embodiment, the fourth insulating layer INS4 may be formed of multiple layers. In the case where the fourth insulating layer INS4 has a multi-layer structure, the fourth insulating layer INS4 may have a structure formed by alternately stacking insulating layers and organic insulating layers. For example, the fourth insulating layer INS4 may have a structure formed by successively stacking a first inorganic insulating layer, an organic insulating layer, and a second inorganic insulating layer.

The second contact electrode CNE2 may be provided on the second electrode REL2 to electrically and/or physically reliably connect the second electrode REL2 with another end of the opposite ends EP1 and EP2 of each of the light emitting elements LD.

The second contact electrode CNE2 may include the same material as that of the first contact electrode CNE1. The second contact electrode CNE2 may cover the second electrode REL2 and overlap the second electrode REL2. Furthermore, the second contact electrode CNE2 may cover another end of the opposite ends EP1 and EP2 of each of the light emitting elements LD, and overlap the another end.

In an embodiment of the disclosure, the second contact electrode CNE2 may be provided in the form of a bar extending from the first area FA of each of the first to third sub-pixels SP1, SP2, and SP3 to the second area SA, but the disclosure is not limited thereto. In an embodiment, the second contact electrode CNE2 may be provided to overlap the second electrode REL2 disposed in the first area FA of each of the first to third sub-pixels SP1, SP2, and SP3 and overlap the second electrode REL2 disposed in the second area SA of the corresponding sub-pixel, in such a way that parts of the second contact electrode CNE2 may be spaced apart from each other by areas of each sub-pixel.

In the case where the second contact electrode CNE2 is provided in a shape extending from the first area FA of each of the first to third sub-pixels SP1, SP2, and SP3 to the second area SA, the second contact electrode CNE2 may overlap with the second capping layer CPL2.

A fifth insulating layer INS5 for covering the second contact electrode CNE2 may be provided on the second contact electrode CNE2. The fifth insulating layer INS5 may prevent the second contact electrode CNE2 from being exposed to the outside, thus preventing the second contact electrode CNE2 from being corroded. The fifth insulating layer INS5 may be formed of either an inorganic insulating layer or an organic insulating layer.

An overcoat layer OC may be provided on the fifth insulating layer INS5. The overcoat layer OC may be a planarization layer for mitigating a step difference formed by the partition wall PW, the first and second electrodes REL1 and REL2, the first and second contact electrodes CNE1 and CNE2, etc. that may be disposed under the overcoat layer. The overcoat layer OC may be an encapsulating layer provided to prevent oxygen, water, or the like from penetrating into the light emitting elements LD. In some embodiments, the overcoat layer OC may be omitted.

As described above, voltages may be applied through the first electrode REL1 and the second electrode REL2 to the opposite ends EP1 and EP2 of each of the light emitting elements LD aligned in the first area FA and the second area SA of each of the first to third sub-pixels SP1, SP2, and SP3. Hence, each of the light emitting elements LD may emit light by recombination of electron-hole pairs in the active layer 12 of each of the light emitting elements LD. Here, the active layer 12 may emit light having a wavelength range from about 400 nm to about 900 nm.

The second area SA of each of the first to third sub-pixels SP1, SP2, and SP3 may include a transmission area TA through which light passes. In an embodiment of the disclosure, light passing through the transmission area TA may include light emitted from the first area FA and the second area SA of each of the first to third sub-pixels SP1, SP2, and SP3, and/or light drawn into the substrate SUB.

The transmission area TA may be an area in which some components of the display element layer DPL of each sub-pixel (e.g., a configuration including opaque conductive metal) may not be disposed. Here, the some components of the display element layer DPL may include the first electrode REL1 and the second electrode REL2 including opaque conductive material having a reflectivity. For example, the transmission area TA may be an area of the second area SA of each of the first to third sub-pixels SP1, SP2, and SP3, other than an area in which the first electrode REL1 and the second electrode REL2 may be disposed. In other words, the transmission area TA may be provided in such a way that some components of the display element layer DPL may not be disposed in the second area SA of each of the first to third sub-pixels SP1, SP2, and SP3.

In an embodiment, the transmission area TA in the second area SA may include an opening (not illustrated) to allow light to pass through the transmission area TA without loss. In an embodiment of the disclosure, the opening may be formed by removing at least a portion of an insulating layer corresponding to the second area SA of each of the first to third sub-pixels SP1, SP2, and SP3 and removing at least some components for light emission. For example, the opening may be formed by removing the buffer layer BFL, the gate insulating layer GI, the interlayer insulating layer ILD, the passivation layer PSV, etc. The insulating layer that may be removed to form the opening is not limited to that of the foregoing examples. For example, some of the insulating layers included in the display element layer DPL may be removed. The transmission area TA including the opening will be described with reference to FIGS. 10 and 11.

As described above, since the pixel circuit layer PCL of each of the first to third sub-pixels SP1, SP2, and SP3 may be intensively disposed in a specific area of the corresponding sub-pixel, e.g., in the first area FA, and some components of the display element layer DPL of the corresponding sub-pixel may not be provided in the second area SA, a sufficient aperture ratio of the corresponding sub-pixel may be secured. Particularly, in the case where the display device in accordance with an embodiment of the disclosure may be a transparent display device, the transmissivity of light drawn from the rear surface and/or the front surface of the substrate SUB may be increased because a sufficient aperture ratio of each sub-pixel may be secured. Consequently, the image quality of the transparent display device may be enhanced.

In an embodiment of the disclosure, the light transmissivity of the second area SA of each of the first to third sub-pixels SP1, SP2, and SP3 in which the pixel circuit layer PCL may not be disposed may be higher than the light transmissivity of the first area FA of the corresponding sub-pixel in which the pixel circuit layer PCL may be provided. Furthermore, the light transmissivity of the area of the second area SA of each of the first to third sub-pixels SP1, SP2, and SP3 in which at least some components of the display element layer DPL may not be disposed, e.g., the light transmissivity of the transmission area TA, may be higher than the light transmissivity of a remaining area of the second area SA other than the transmission area TA.

Figure 7:
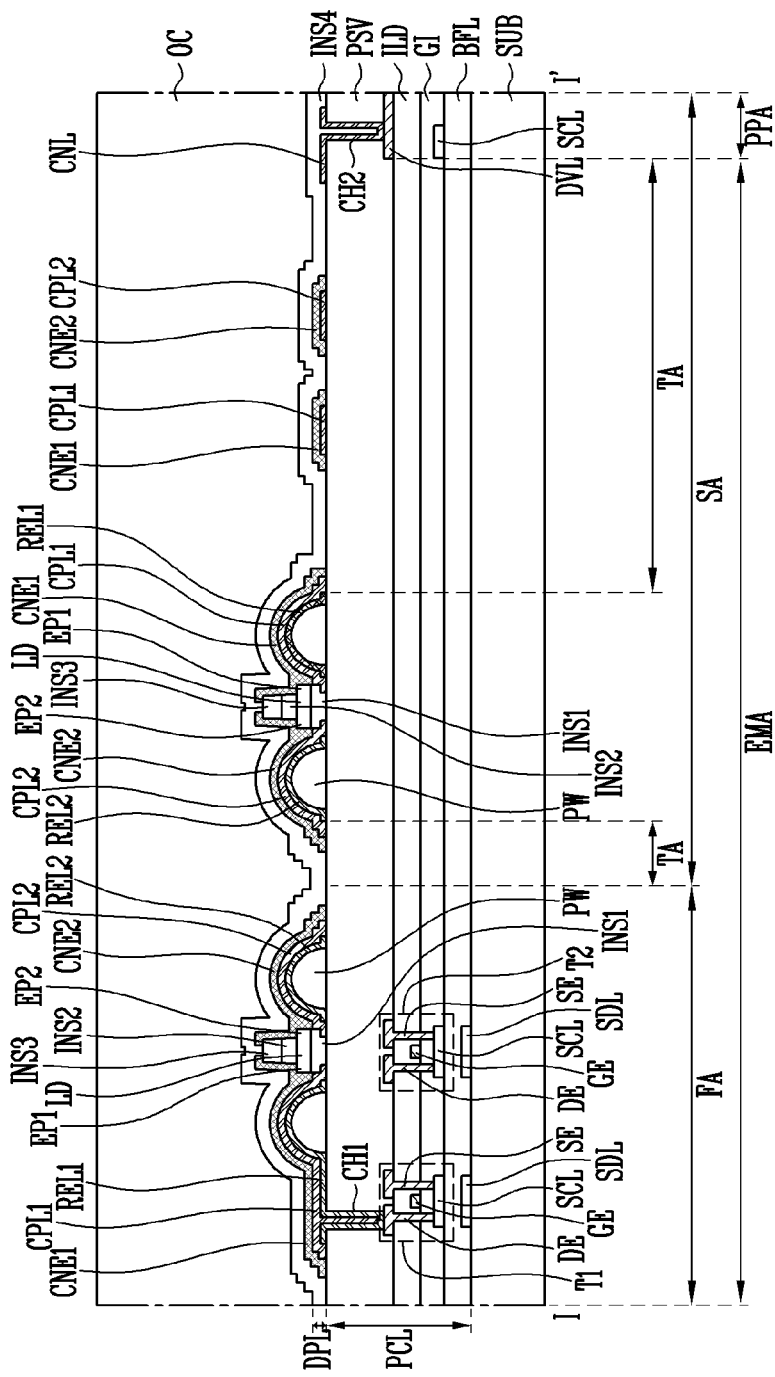
FIG. 7 schematically illustrates a display device in accordance with an embodiment of the disclosure, and is a sectional diagram corresponding to line I-I' of FIG. 4.

FIG. 7 schematically illustrates a display device in accordance with an embodiment of the disclosure, and is a sectional diagram corresponding to line I-I' of FIG. 4.

The configuration of the display device illustrated in FIG. 7, other than the fact that a first contact electrode and a second contact electrode may be disposed on the same layer, may be substantially equal or similar to that of the display device of FIG. 5.

Therefore, with regard to the display device of FIG. 7, the following description will be focused on differences from that of the foregoing embodiments, to avoid redundant explanation. Components which are not separately explained in the following description of the embodiment comply with that of the foregoing embodiments. The same reference numeral will be used to designate the same component, and a similar reference numeral will be used to designate a similar component.

Referring to FIGS. 1A, 2, 4, and 7, the display device in accordance with an embodiment of the disclosure may include a substrate SUB on which pixels PXL may be provided. Each of the pixels PXL may include first to third sub-pixels SP1, SP2, and SP3.

Each of the first to third sub-pixels SP1, SP2, and SP3 may include an emission area EMA which emits light, and a peripheral area PPA disposed around a perimeter of the emission area EMA. Furthermore, each of the first to third sub-pixels SP1, SP2, and SP3 may include a first area FA in which the pixel circuit layer PCL may be disposed, and a second area SA adjacent to the first area FA.

Each of the first to third sub-pixels SP1, SP2, and SP3 may include the substrate SUB, the pixel circuit layer PCL, and a display element layer DPL.

The pixel circuit layer PCL of each of the first to third sub-pixels SP1, SP2, and SP3 may include first and second transistors T1 and T2 and a driving voltage line DVL provided on the substrate SUB, and a passivation layer PSV including first and second contact holes CH1 and CH2.

The display element layer DPL of each of the first to third sub-pixels SP1, SP2, and SP3 may be disposed in the first area FA and the second area SA of the corresponding sub-pixel. The display element layer DPL of each of the first to third sub-pixels SP1, SP2, and SP3 may include a partition wall PW, first and second electrodes REL1 and REL1, first and second capping layers CPL1 and CPL2, light emitting elements LD, and first and second contact electrodes CNE1 and CNE2.

The first and second electrodes REL1 and REL2 may be provided on the same surface and spaced apart from each other. Any electrode of the first electrode REL1 and the second electrode REL2 may be an anode electrode, and another may be a cathode electrode. The first electrode REL1 and the second electrode REL2 may include conductive material having a reflectivity so that light emitted from each of the light emitting elements LD can travel in the display direction of the display device.

Each of the first and second capping layers CPL1 and CPL2 may be provided on a corresponding electrode. In detail, the first capping layer CPL1 may be provided on the first electrode REL1. The second capping layer CPL2 may be provided on the second electrode REL2. The first capping layer CPL1 and the second capping layer CPL2 may be provided on the same surface and spaced apart from each other.

The first capping layer CPL1 and the second capping layer CPL2 each may be provided in a shape extending from the first area FA of each of the first to third sub-pixels SP1, SP2, and SP3 to the second area SA. The first electrode REL1 of the first area FA and the first electrode REL1 of the second area SA may be electrically and/or physically connected to each other through the first capping layer CPL1. Likewise, the second electrode REL2 of the first area FA and the second electrode REL2 of the second area SA may be electrically and/or physically connected to each other through the second capping layer CPL2.

In an embodiment of the disclosure, the first capping layer CPL1 and the second capping layer CPL2 may be formed of transparent conductive material to minimize loss of light emitted from each of the light emitting elements LD and enhance the transmissivity of light passing through the second area SA of each of the first to third sub-pixels SP1, SP2, and SP3.

The first contact electrode CNE1 and the second contact electrode CNE2 each may be provided on a corresponding electrode and be electrically and/or physically connected to the corresponding electrode. For example, the first contact electrode CNE1 may be provided on the first electrode REL1 and electrically and/or physically connected with the first electrode REL1. The second contact electrode CNE2 may be provided on the second electrode REL2 and electrically and/or physically connected with the second electrode REL2. In detail, the first contact electrode CNE1 may be provided (e.g., directly provided) on the first capping layer CPL1 and electrically and/or physically connected with the first electrode REL1 disposed under the first capping layer CPL1. The second contact electrode CNE2 may be provided (e.g., directly provided) on the second capping layer CPL2 and electrically and/or physically connected with the second electrode REL2 disposed under the second capping layer CPL2.

In an embodiment of the disclosure, the first contact electrode CNE1 and the second contact electrode CNE2 may be provided on the same surface, and may be spaced apart from each other by a distance on the third insulating layer INS3 and thus electrically and/or physically separated from each other. In other words, the first contact electrode CNE1 and the second contact electrode CNE2 may be provided on the same layer and formed through the same manufacturing process.

A fourth insulating layer INS4 for covering the first and second contact electrodes CNE1 and CNE2 may be provided on the first contact electrode CNE1 and the second contact electrode CNE2. The fourth insulating layer INS4 may correspond to the fifth insulating layer INS5 illustrated in FIG. 5. The fourth insulating layer INS4 may prevent the first and second contact electrodes CNE1 and CNE2 from being exposed to the outside, thus preventing the first and second contact electrodes CNE1 and CNE2 from being corroded.

Figure 8:
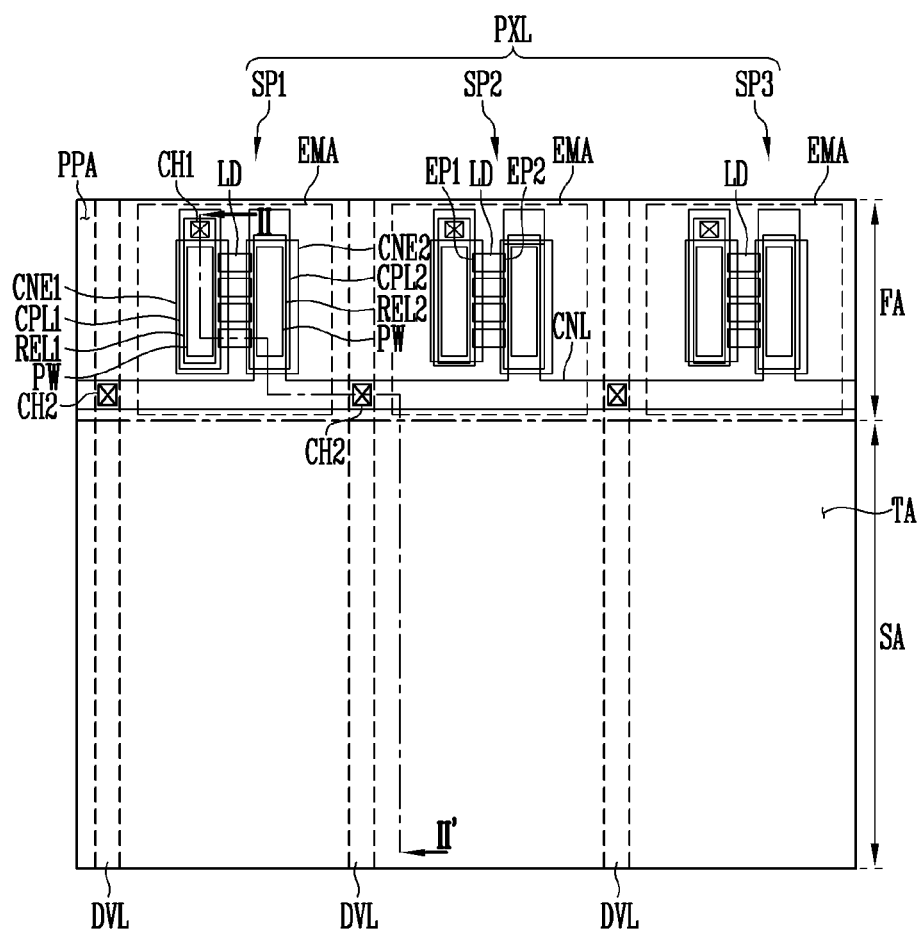
FIG. 8 is a plan view schematically illustrating a pixel of a display device in accordance with an embodiment of the present disclosure.
Figure 9:
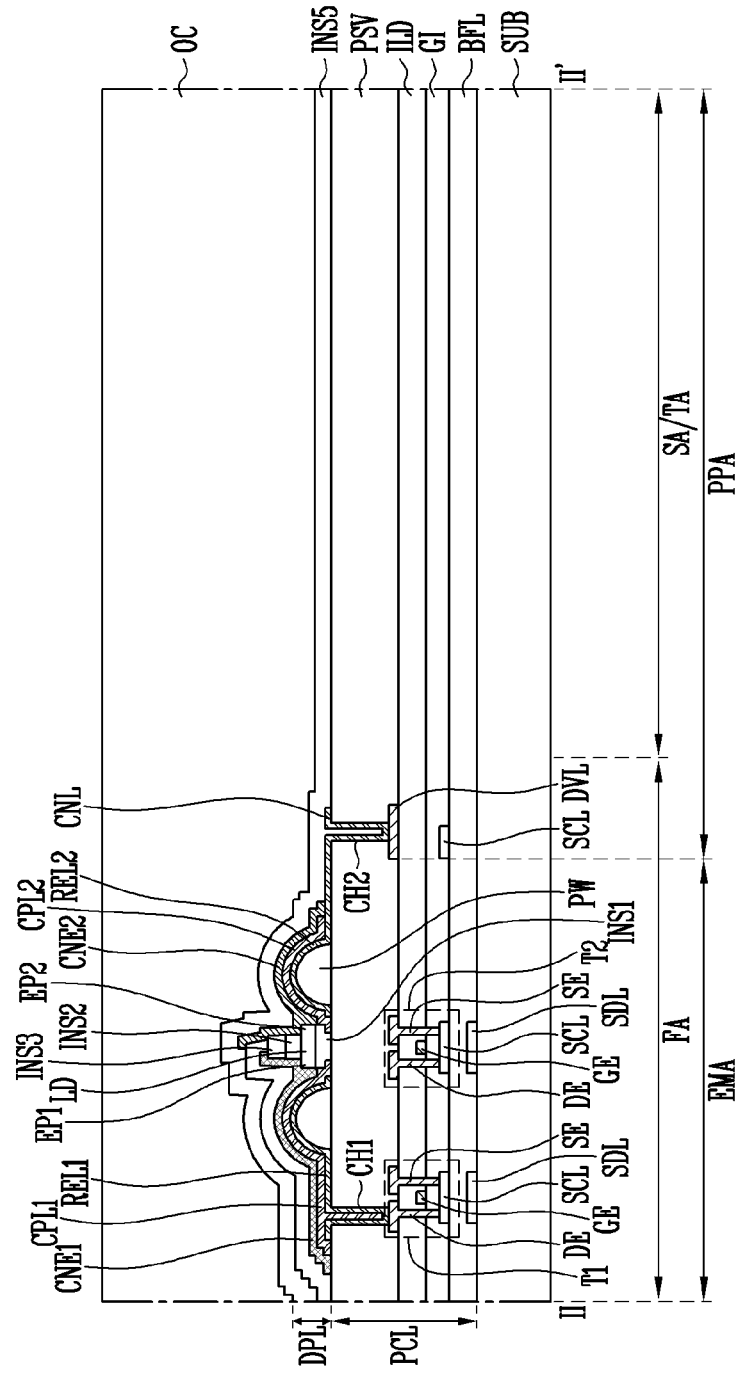
FIG. 9 is a schematic sectional view taken along line II-II' of FIG. 8.

FIG. 8 is a plan view schematically illustrating a pixel of a display device in accordance with an embodiment of the disclosure. FIG. 9 is a schematic sectional view taken along line II-II' of FIG. 8.

The configuration of the display device of FIGS. 8 and 9, other than the fact that a display element layer may not be disposed in a second area of each sub-pixel, may be substantially equal or similar to that of the display device of FIGS. 4 and 5.

Therefore, to avoid redundant explanation, the description of the display device of FIGS. 8 and 9 will be focused on differences from that of the foregoing embodiments. Components which are not separately explained in the following description of the embodiment comply with that of the foregoing embodiments. The same reference numeral will be used to designate the same component, and a similar reference numeral will be used to designate a similar component.

Referring to FIGS. 1A, 2, 8, and 9, the display device in accordance with an embodiment of the disclosure may include a substrate SUB on which pixels PXL may be provided. Each of the pixels PXL may include first to third sub-pixels SP1, SP2, and SP3.

Each of the first to third sub-pixels SP1, SP2, and SP3 may include an emission area EMA which emits light, and a peripheral area PPA disposed around a perimeter of the emission area EMA. Furthermore, each of the first to third sub-pixels SP1, SP2, and SP3 may include a first area FA in which the pixel circuit layer PCL may be disposed, and a second area SA adjacent to the first area FA.

Each of the first to third sub-pixels SP1, SP2, and SP3 may include the substrate SUB, the pixel circuit layer PCL, and a display element layer DPL.

The pixel circuit layer PCL of each of the first to third sub-pixels SP1, SP2, and SP3 may be disposed in the first area FA of the corresponding sub-pixel, and include first and second transistors T1 and T2 and a driving voltage line DVL provided on the substrate SUB, and a passivation layer PSV including first and second contact holes CH1 and CH2. The pixel circuit layer PCL of each sub-pixel may further include a light shielding pattern SDL provided between each of the first and second transistors T1 and T2 and the substrate SUB.

In an embodiment of the disclosure, the display element layer DPL of each of the first to third sub-pixels SP1, SP2, and SP3 may be disposed in the first area FA of the corresponding sub-pixel. In detail, the display element layer DPL of each of the first to third sub-pixels SP1, SP2, and SP3 may be disposed on the pixel circuit layer PCL of the first area FA of the corresponding sub-pixel. In other words, the display element layer DPL of each of the first to third sub-pixels SP1, SP2, and SP3 may overlap the pixel circuit layer PCL of the corresponding sub-pixel. In the case where the display element layer DPL of each of the first to third sub-pixels SP1, SP2, and SP3 may be disposed in only the first area FA of the corresponding sub-pixel, the emission area EMA of the corresponding sub-pixel may correspond to the first area FA.

For the sake of explanation, the first area FA of each of the first to third sub-pixels SP1, SP2, and SP3 will be described, and the second area SA of the corresponding sub-pixel will be described.

The display element layer DPL in the first area FA of each of the first to third sub-pixels SP1, SP2, and SP3 may include a partition wall PW, a connection line CNL, first and second electrodes REL1 and REL2, first and second capping layers CPL1 and CPL2, and first and second contact electrodes CNE1 and CNE2.

The connection line CNL may extend in a first direction DR1 (e.g., 'horizontal direction'). The connection line CNL may be provided in common to the first to third sub-pixels SP1, SP2, and SP3. Therefore, the first to third sub-pixels SP1, SP2, and SP3 may be connected in common to the connection line CNL. The connection line CNL may be provided on the same layer as that of the second electrode REL2 and include the same material as that of the second electrode REL2. In detail, the connection line CNL and the second electrode REL2 may be integrally provided and electrically and/or physically connected to each other. In the case where the second electrode REL2 and the connection line CNL may be formed and/or provided integrally with each other, the connection line CNL may be regarded as one area of the second electrode REL2.

The connection line CNL may be connected to the driving voltage line DVL disposed in the peripheral area PPA of each of the first to third sub-pixels SP1, SP2, and SP3 through the second contact hole CH2 of the passivation layer PSV. Hence, the voltage of the second driving power supply (refer to VSS of FIG. 3A) that may be applied to the driving voltage line DVL may be transmitted to the connection line CNL.

The first electrode REL1 and the second electrode REL2 may be provided on the partition wall PW, and spaced apart from each other. The first electrode REL1 may be electrically connected to the first transistor T1 of the pixel circuit layer PCL through the first contact hole CH1 of the passivation layer PSV. Hence, a signal applied to the first transistor T1 may be transmitted to the first electrode REL1. The second electrode REL2 may be integrally provided with the connection line CNL, and electrically and/or physically connected with the connection line CNL. Hence, the voltage of the second driving power supply VSS that may be applied to the connection line CNL may be transmitted to the second electrode REL2.

The first electrode REL1 and the second electrode REL2 may function as alignment electrodes for aligning the light emitting elements LD in the emission area EMA of each of the first to third sub-pixels SP1, SP2, and SP3. Furthermore, the first electrode REL1 and the second electrode REL2 may function as driving electrodes for driving the light emitting elements LD after the light emitting elements LD have been aligned.

The first capping layer CPL1 may be provided on the first electrode REL1 and electrically and/or physically connected with the first electrode REL1. The second capping layer CPL2 may be provided on the second electrode REL2 and electrically and/or physically connected with the second electrode REL2. In an embodiment of the disclosure, the first capping layer CPL1 and the second capping layer CPL2 may be provided in only the first area FA of each of the first to third sub-pixels SP1, SP2, and SP3, but the disclosure is not limited thereto. In an embodiment, the first capping layer CPL1 and the second capping layer CPL2 each may be provided in a shape extending from the first area FA of each of the first to third sub-pixels SP1, SP2, and SP3 to the second area SA of the corresponding sub-pixel.

The first contact electrode CNE1 may be provided on the first electrode REL1 and an end of the opposite ends EP1 and EP2 of each of the light emitting elements LD to electrically and/or physically connect an end of each of the light emitting elements LD with the first electrode REL1. The second contact electrode CNE2 may be provided on the second electrode REL2 and another end of the opposite ends EP1 and EP2 of each of the light emitting elements LD to electrically and/or physically connect another end of each of the light emitting elements LD with the second electrode REL2.

In an embodiment of the disclosure, the first contact electrode CNE1 and the second contact electrode CNE2 may be provided in only the first area FA of each of the first to third sub-pixels SP1, SP2, and SP3, but the disclosure is not limited thereto. In an embodiment, the first contact electrode CNE1 and the second contact electrode CNE2 each may be provided in a shape extending from the first area FA of each of the first to third sub-pixels SP1, SP2, and SP3 to the second area SA of the corresponding sub-pixel.

The first area FA of each of the first to third sub-pixels SP1, SP2, and SP3 that includes the display element layer DPL include the emission area EMA from which light may be emitted.

The second area SA of each of the first to third sub-pixels SP1, SP2, and SP3 will be described.

The substrate SUB, insulating layers included in the pixel circuit layer PCL, and insulating layers included in the display element layer DPL may be disposed in the second area SA of each of the first to third sub-pixels SP1, SP2, and SP3. In detail, the substrate SUB, the buffer layer BFL, the gate insulating layer GI, the interlayer insulating layer ILD, the passivation layer PSV, the fifth insulating layer INS5, and the overcoat layer OC may be provided in the second area SA of each of the first to third sub-pixels SP1, SP2, and SP3. However, the layers included in the second area SA of each of the first to third sub-pixels SP1, SP2, and SP3 are not limited to those illustrated in the drawings. For example, some of the layers included in the second area SA may be omitted, and other layers may be further provided.

The second area SA of each of the first to third sub-pixels SP1, SP2, and SP3 may include a transmission area TA through which light passes. The transmission area TA may be an area in which the first and second electrodes REL1 and REL2 included in the display element layer DPL of each of the first to third sub-pixels SP1, SP2, and SP3 may not be disposed, and may be an area from which light may not be emitted.

In an embodiment of the disclosure, the transmission area TA of each of the first to third sub-pixels SP1, SP2, and SP3 may correspond to the second area SA of the corresponding sub-pixel. In other words, the transmission area TA of each of the first to third sub-pixels SP1, SP2, and SP3 may have the same surface area (or size) as that of the second area SA of the corresponding sub-pixel.

As described above, in a specific area of each of the first to third sub-pixels SP1, SP2, and SP3, i.e., the first area FA, the pixel circuit layer PCL and the display element layer DPL of the corresponding sub-pixel may be disposed, and components for light emission, e.g., the display element layer DPL, may not be disposed in the second area SA. Consequently, the transmission area TA of the corresponding sub-pixel may be further increased. Hence, the aperture ratio of each of the first to third sub-pixels SP1, SP2, and SP3 may be increased, and the light transmissivity of the corresponding sub-pixel may be increased.

Figure 10:
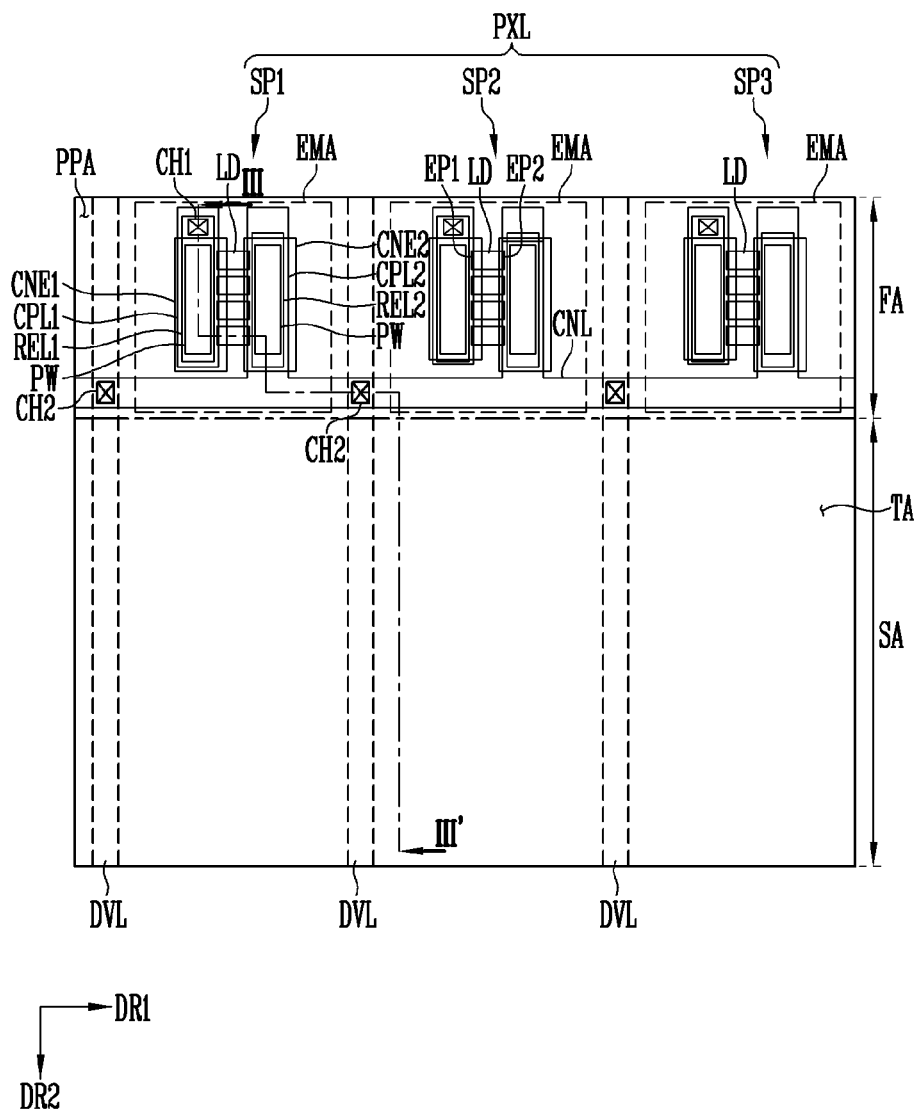
FIG. 10 is a plan view schematically illustrating a pixel of a display device in accordance with an embodiment of the present disclosure.
Figure 11:
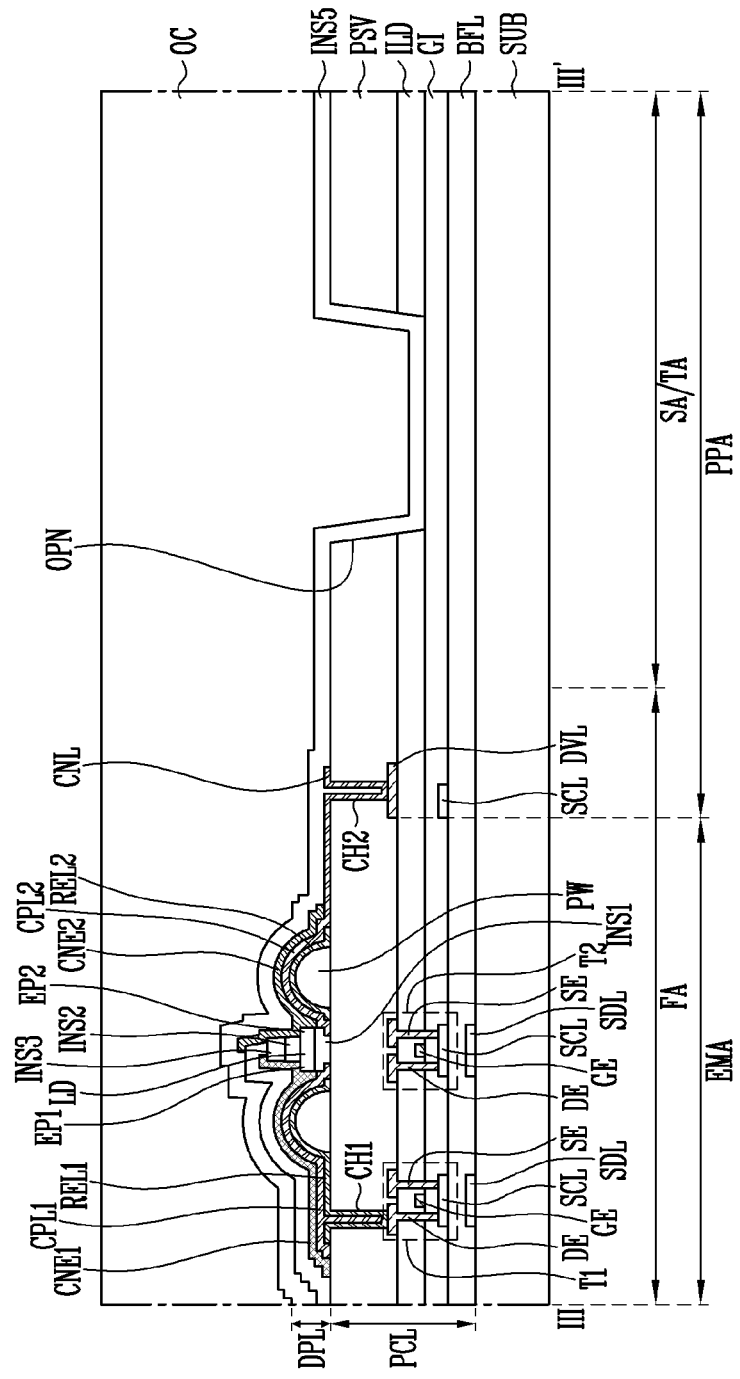
FIG. 11 is a schematic sectional diagram taken along line III-III' of FIG. 10.

FIG. 10 is a plan view schematically illustrating a pixel of a display device in accordance with an embodiment of the disclosure. FIG. 11 is a schematic sectional view taken along line III-III' of FIG. 10.

The configuration of the display device of FIGS. 10 and 11, other than the fact that a connection line may be integrally provided with a second capping layer and a transmission area included in a second area includes an opening, may be substantially equal or similar to that of the display device of FIGS. 8 and 9.

Therefore, to avoid redundant explanation, the description of the display device of FIGS. 10 and 11 will be focused on differences from that of the foregoing embodiments. Components which are not separately explained in the following description of the embodiment comply with that of the foregoing embodiments. The same reference numeral will be used to designate the same component, and a similar reference numeral will be used to designate a similar component.

Referring to FIGS. 1A, 2, 10, and 11, the display device in accordance with an embodiment of the disclosure may include a substrate SUB on which pixels PXL may be provided. Each pixel PXL may include first to third sub-pixels SP1, SP2, and SP3.

Furthermore, each of the first to third sub-pixels SP1, SP2, and SP3 may include a first area FA in which the pixel circuit layer PCL and the display element layer DPL may be disposed, and a second area SA adjacent to the first area FA. In an embodiment of the disclosure, the display element layer DPL of each of the first to third sub-pixels SP1, SP2, and SP3 may be disposed on the pixel circuit layer PCL in the first area FA of the corresponding sub-pixel. In other words, the display element layer DPL of each of the first to third sub-pixels SP1, SP2, and SP3 may overlap the pixel circuit layer PCL of the corresponding sub-pixel.

The display element layer DPL in the first area FA of each of the first to third sub-pixels SP1, SP2, and SP3 may include a partition wall PW, first and second electrodes REL1 and REL2, first and second capping layers CPL1 and CPL2, a connection line CNL, and first and second contact electrodes CNE1 and CNE2.

The connection line CNL may extend in a first direction DR1 (e.g., 'horizontal direction'). The connection line CNL may be provided in common to the first to third sub-pixels SP1, SP2, and SP3. Therefore, the first to third sub-pixels SP1, SP2, and SP3 may be connected in common to the connection line CNL.

In an embodiment of the disclosure, the connection line CNL may be provided on the same layer as that of the second capping layer CPL2, and include the same material as that of the second capping layer CPL2. In detail, the connection line CNL and the second capping layer CPL2 may be integrally provided and electrically and/or physically connected to each other. In the case where the second capping layer CPL2 and the connection line CNL may be integrally formed and/or provided, the connection line CNL may be regarded as one area of the second capping layer CPL2.

The connection line CNL may be connected to the driving voltage line DVL disposed on the peripheral area PPA of each sub-pixel through the second contact hole CH2 of the passivation layer PSV. Hence, the voltage of the second driving power supply (refer to VSS of FIG. 3A) that may be applied to the driving voltage line DVL may be transmitted to the connection line CNL. As described above, since the connection line CNL may be provided integrally with the second capping layer CPL2, the voltage of the second driving power supply VSS that may be applied to the connection line CNL may be transmitted to the second capping layer CPL2.

The first capping layer CPL1 may be provided on the first electrode REL1 and electrically and/or physically connected with the first electrode REL1. In an embodiment of the disclosure, the first capping layer CPL1 may be provided in only the first area FA of each of the first to third sub-pixels SP1, SP2, and SP3, but the disclosure is not limited thereto. In an embodiment, the first capping layer CPL1 may be provided in a shape extending from the first area FA of each of the first to third sub-pixels SP1, SP2, and SP3 to the second area SA of the corresponding sub-pixel.

The second capping layer CPL2 may be provided on the second electrode REL2 and electrically and/or physically connected with the second electrode REL2. In an embodiment of the disclosure, the second capping layer CPL2 may be provided in only the first area FA of each of the first to third sub-pixels SP1, SP2, and SP3, but the disclosure is not limited thereto. In an embodiment, the second capping layer CPL2 may be provided in a shape extending from the first area FA of each of the first to third sub-pixels SP1, SP2, and SP3 to the second area SA of the corresponding sub-pixel. In an embodiment of the disclosure, since the second capping layer CPL2 is electrically and/or physically connected with the second electrode REL2, the voltage of the second driving power supply VSS that may be applied to the second capping layer CPL2 may be transmitted to the second electrode REL2.

In an embodiment of the disclosure, the first capping layer CPL1 and the second capping layer CPL2 may be formed of transparent conductive material to minimize loss of light emitted from each of the light emitting elements LD and enhance the transmissivity of light passing through the first area FA of each of the first to third sub-pixels SP1, SP2, and SP3. Since the second capping layer CPL2 may be integrally provided with the connection line CNL, the connection line CNL may also be formed of transparent conductive material.

The second area SA of each of the first to third sub-pixels SP1, SP2, and SP3 may include a transmission area TA through which light passes. In an embodiment of the disclosure, the transmission area TA may be an area in which some components of the display element layer DPL of each of the first to third sub-pixels SP1, SP2, and SP3, e.g., the first electrode REL1 and the second electrode REL2, may not be disposed, and may be an area from which light may not be emitted. The transmission area TA of each of the first to third sub-pixels SP1, SP2, and SP3 may have the same surface area (or size) as that of the second area SA of the corresponding sub-pixel.

An opening OPN may be provided in the transmission area TA included in the second area SA of each of the first to third sub-pixels SP1, SP2, and SP3. The opening OPN may be formed by removing at least a portion of an insulating layer disposed in the second area SA of each of the first to third sub-pixels SP1, SP2, and SP3 and removing components of the display element layer DPL for light emission. For example, the opening OPN may be formed by removing the interlayer insulating layer ILD and the passivation layer PSV from the second area SA of each of the first to third sub-pixels SP1, SP2, and SP3. However, the components that may be removed to form the opening OPN are not limited to the foregoing examples. For example, the gate insulating layer GI or the buffer layer BFL may also be removed.

In the case where the opening OPN may be formed in the transmission area TA, the overcoat layer OC may be provided in such a way that the opening OPN may be filled with the overcoat layer OC. The overcoat layer OC may be formed of transparent material to minimize loss of light passing through the opening OPN.

Since the opening OPN may be formed in the transmission area TA included in the second area SA of each of the first to third sub-pixels SP1, SP2, and SP3, light drawn into a rear surface and/or a front surface of the substrate SUB may pass through the opening OPN without optical loss due to interference or the like. Hence, the aperture ratio in the second area SA of each of the first to third sub-pixels SP1, SP2, and SP3 may be further increased.

As described above, in a specific area of each of the first to third sub-pixels SP1, SP2, and SP3, i.e., the first area FA, the pixel circuit layer PCL and the display element layer DPL of the corresponding sub-pixel may be disposed, and the display element layer DPL may not be disposed in the second area SA. Consequently, the transmission area TA of the corresponding sub-pixel may be further increased. Hence, the aperture ratio of each of the first to third sub-pixels SP1, SP2, and SP3 may be increased, and the light transmissivity of the corresponding sub-pixel may be increased.

Furthermore, since the opening OPN may be formed in the second area SA of each of the first to third sub-pixels SP1, SP2, and SP3, light drawn into the rear surface and/or the front surface of the substrate SUB on the second area SA may pass through the opening OPN without optical loss, so that the light transmissivity of the corresponding sub-pixel may be further increased.

Figure 12:
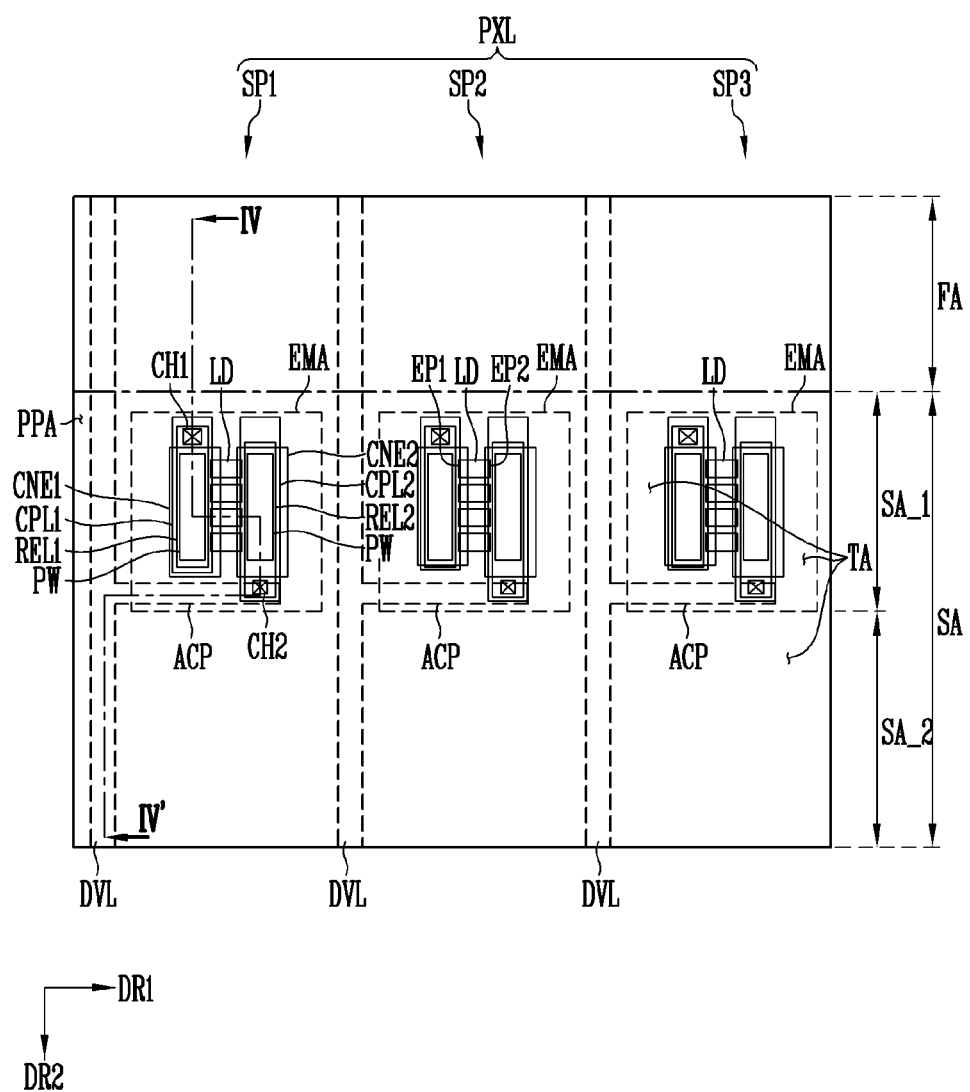
FIG. 12 is a plan view schematically illustrating a pixel of a display device in accordance with an embodiment of the present disclosure.
Figure 13:
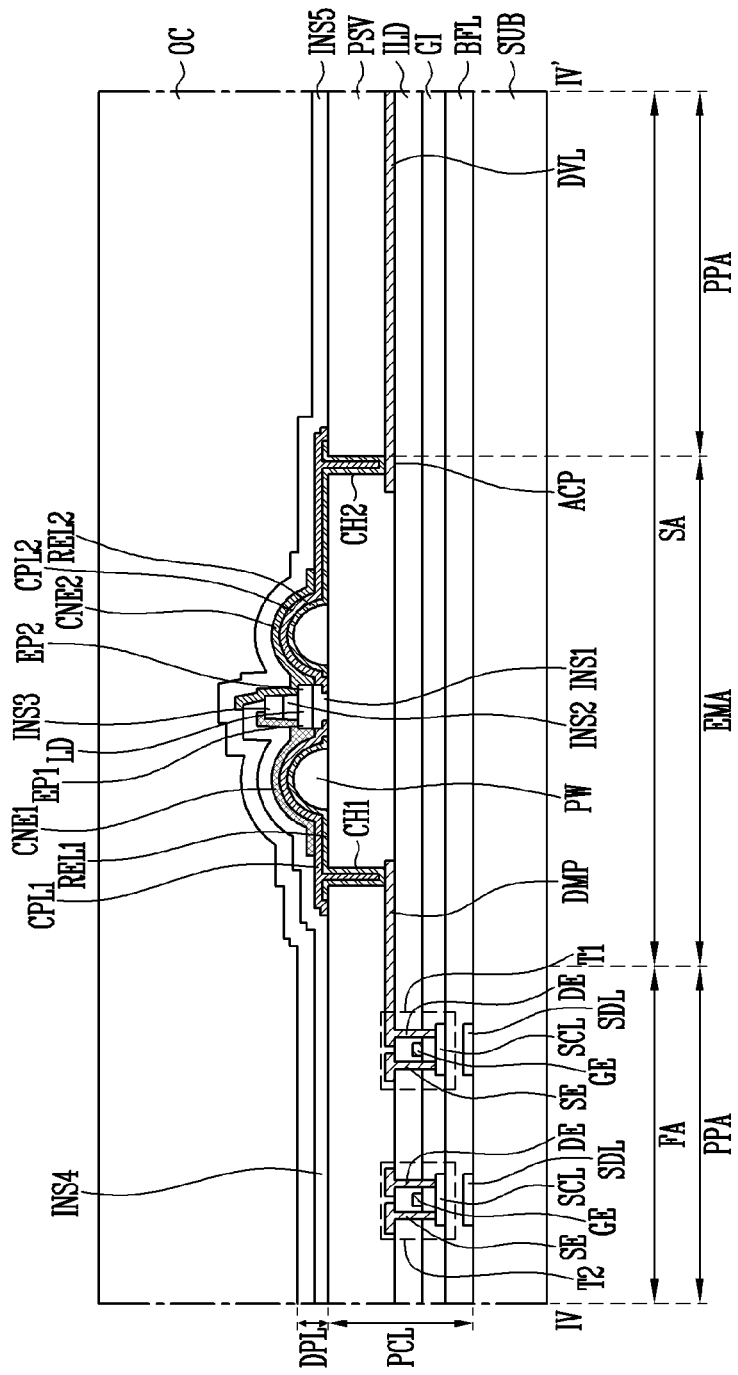
FIG. 13 is a schematic sectional diagram taken along line IV-IV' of FIG. 12.

FIG. 12 is a plan view schematically illustrating a pixel of a display device in accordance with an embodiment of the disclosure. FIG. 13 is a sectional view taken along line IV-IV' of FIG. 12.

The configuration of the display device of FIGS. 12 and 13, other than the fact that a display element layer of each sub-pixel may be provided in at least a portion of a second area, may be substantially equal or similar to that of the display device of FIGS. 4 and 5.

Therefore, to avoid redundant explanation, the description of the display device of FIGS. 12 and 13 will be focused on differences from that of the foregoing embodiments. Components which are not separately explained in the following description of the embodiment of the disclosure comply with that of the foregoing embodiments. The same reference numeral will be used to designate the same component, and a similar reference numeral will be used to designate a similar component.

Referring to FIGS. 1A, 2, 12, and 13, the display device in accordance with an embodiment of the disclosure may include a substrate SUB on pixels PXL may be provided. Each pixel PXL may include first to third sub-pixels SP1, SP2, and SP3.

Each of the first to third sub-pixels SP1, SP2, and SP3 may include a first area FA, and a second area SA adjacent to the first area FA.

In an embodiment of the disclosure, in the first area FA of each of the first to third sub-pixels SP1, SP2, and SP3, a pixel circuit layer PCL of the corresponding sub-pixel may be disposed. A display element layer DPL may be disposed in the second area SA of the corresponding sub-pixel.

For the sake of explanation, the first area FA of each of the first to third sub-pixels SP1, SP2, and SP3 will be described, and the second area SA of the corresponding sub-pixel will be described.

In the first area FA of each of the first to third sub-pixels SP1, SP2, and SP3, the pixel circuit layer PCL may include first and second transistors T1 and T2 provided on the substrate SUB, a dummy pattern DMP, a driving voltage line DVL, and a passivation layer PSV. The pixel circuit layer PCL may further include a light shielding pattern SDL provided between each of the first and second transistors T1 and T2 and the substrate SUB.

Each of the first transistor T1 and the second transistor T2 may include a semiconductor layer SCL, a gate electrode GE, a source electrode SE, and a drain electrode DE.

The dummy pattern DMP may be provided on the same layer as that of the drain electrode DE of the first transistor T1 and include the same material as that of the drain electrode DE. In detail, the dummy pattern DMP may be integrally provided with the drain electrode DE of the first transistor T1 and electrically and/or physically connected with the drain electrode DE of the first transistor T1. In the case where the drain electrode DE of the first transistor T1 and the dummy pattern DMP may be integrally formed and/or provided, the dummy pattern DMP may be regarded as one area of the drain electrode DE of the first transistor T1.

The dummy pattern DMP may extend from the drain electrode DE of the first transistor T1 to the second area SA of each of the first to third sub-pixels SP1, SP2, and SP3. Particularly, in an embodiment of the disclosure, the dummy pattern DMP may extend to the second area SA of each of the first to third sub-pixels SP1, SP2, and SP3 and be electrically connected to the display element layer DPL disposed in the second area SA of the corresponding sub-pixel through a first contact hole CH1 of the passivation layer PSV.

The driving voltage line DVL may extend from the peripheral area PPA of each of the first to third sub-pixels SP1, SP2, and SP3 in a second direction DR2 (e.g., 'vertical direction'). In an embodiment of the disclosure, the driving voltage line DVL may include an additional conductive pattern ACP extending from the driving voltage line DVL in a first direction DR1 (e.g., 'horizontal direction') intersecting with the second direction DR2.

The driving voltage line DVL and the additional conductive pattern ACP may be provided on the same layer and include the same material. In detail, the driving voltage line DVL and the additional conductive pattern ACP may be integrally provided and electrically and/or physically connected to each other. In the case where the driving voltage line DVL and the additional conductive pattern ACP may be integrally formed and/or provided, the additional conductive pattern ACP may be regarded as one area of the driving voltage line DVL. However, the disclosure is not limited thereto. In an embodiment, the driving voltage line DVL and the additional conductive pattern ACP may be separately formed, and electrically connected to each other through a contact hole or a via hole, which is not shown.

In an embodiment of the disclosure, the additional conductive pattern ACP may be provided in the second area SA of each of the first to third sub-pixels SP1, SP2, and SP3. The additional conductive pattern ACP may be electrically connected with the second electrode REL2 of the display element layer DPL disposed in the second area SA of each of the first to third sub-pixels SP1, SP2, and SP3 through a second contact hole CH2 of the passivation layer PSV. As described above, since the additional conductive pattern ACP may be integrally provided with the driving voltage line DVL, the voltage of the second driving power supply (refer to VSS of FIG. 3A) that may be applied to the driving voltage line DVL may be transmitted to the second electrode REL2 through the additional conductive pattern ACP.

The passivation layer PSV may cover the first and second transistors T1 and T2, the dummy pattern DMP, the driving voltage line DVL, and the additional conductive pattern ACP, and be provided on the substrate SUB in the first and second areas FA and SA of each of the first to third sub-pixels SP1, SP2, and SP3. In an embodiment of the disclosure, each of the first contact hole CH1 and the second contact hole CH2 of the passivation layer PSV may be provided in the second area SA of each of the first to third sub-pixels SP1, SP2, and SP3, but the disclosure is not limited thereto. In an embodiment, the first contact hole CH1 and the second contact hole CH2 of the passivation layer PSV may be disposed in the first area FA of each of the first to third sub-pixels SP1, SP2, and SP3.

The second area SA of each of the first to third sub-pixels SP1, SP2, and SP3 will be described.

The display element layer DPL in the second area SA of each of the first to third sub-pixels SP1, SP2, and SP3 may include a partition wall PW, first and second electrodes REL1 and REL2, first and second capping layers CPL1 and CPL2, light emitting elements LD, and first and second contact electrodes CNE1 and CNE2.

The first electrode REL1 and the second electrode REL2 may be provided on the same surface and spaced apart from each other. The first electrode REL1 may be electrically connected to the drain electrode DE of the first transistor T1 included in the pixel circuit layer PCL of the first area FA through the first contact hole CH1 of the passivation layer PSV and the dummy pattern DMP. Hence, a signal applied to the first transistor T1 may be transmitted to the first electrode REL1 and eventually supplied to an end of the opposite ends EP1 and EP2 of each light emitting element LD. The second electrode REL2 may be electrically connected to the driving voltage line DVL through the second contact hole CH2 of the passivation layer PSV and the additional conductive pattern ACP. Hence, the voltage of the second driving power supply VSS that may be applied to the driving voltage line DVL may be transmitted to the second electrode REL2 and eventually supplied to another end of the opposite ends EP1 and EP2 of each light emitting element LD.

The first capping layer CPL1 may be provided on the first electrode REL1 and electrically and/or physically connected with the first electrode REL1. The second capping layer CPL2 may be provided on the second electrode REL2 and electrically and/or physically connected with the second electrode REL2. In an embodiment of the disclosure, the first capping layer CPL1 and the second capping layer CPL2 may be provided in only the second area SA of each of the first to third sub-pixels SP1, SP2, and SP3, but the present disclosure is not limited thereto. In an embodiment, the first capping layer CPL1 and the second capping layer CPL2 each may be provided in a shape extending from the second area SA of each of the first to third sub-pixels SP1, SP2, and SP3 to the first area FA of the corresponding sub-pixel.

The first contact electrode CNE1 may be provided on the first electrode REL1 and an end of the opposite ends EP1 and EP2 of each of the light emitting elements LD to electrically and/or physically connect the end of each of the light emitting elements LD with the first electrode REL1. The second contact electrode CNE2 may be provided on the second electrode REL2 and another end of the opposite ends EP1 and EP2 of each of the light emitting elements LD to electrically and/or physically connect another end of each of the light emitting elements LD with the second electrode REL2.

In an embodiment of the disclosure, the second area SA of each of the first to third sub-pixels SP1, SP2, and SP3 may be divided into a 2-1th area SA_1 and a 2-2th area SA_2. The 2-1th area SA1 may be an area in which the display element layer DPL including components for light emission may be provided. The 2-2th area SA_2 may be an area in which the display element layer DPL may not be provided. Each of the 2-1th area SA_1 and the 2-2th area SA_2 may include a transmission area TA through which light passes.

The transmission area TA may be an area in which the first and second electrodes REL1 and REL2 of the display element layer DPL may not be disposed in the second area SA of each of the first to third sub-pixels SP1, SP2, and SP3, and may be an area from which light may not be emitted. The transmission area TA may be provided in such a way that some components of the display element layer DPL may not be disposed in the second area SA of each of the first to third sub-pixels SP1, SP2, and SP3, or all components of the display element layer DPL may not be disposed in the second area SA.

As described above, since the pixel circuit layer PCL of each of the first to third sub-pixels SP1, SP2, and SP3 may be disposed in the first area FA of the corresponding sub-pixel, and the display element layer DPL of the corresponding sub-pixel may not be provided in a portion of the second area SA, e.g., in the 2-2th area SA_2, a sufficient aperture ratio of the corresponding sub-pixel may be secured. Particularly, in the case where the display device in accordance with an embodiment of the disclosure is a transparent display device, the transmissivity of light drawn from the rear surface of the substrate SUB may be increased because a sufficient aperture ratio of each sub-pixel may be secured. Consequently, the image quality of the transparent display device may be enhanced.

Figure 14:
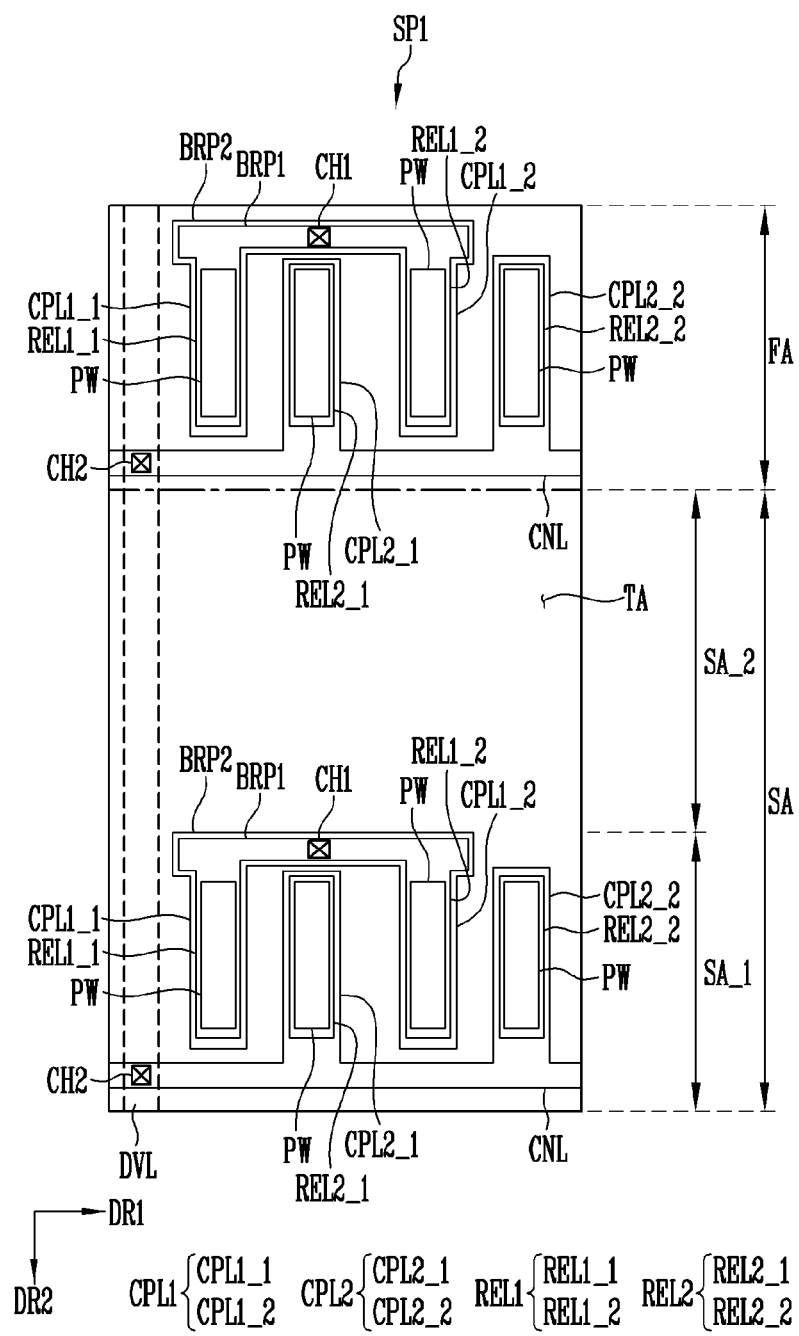
FIGS. 14 and 15 illustrate an embodiment of a first sub-pixel of FIG. 4, and are plan views schematically illustrating the first sub-pixel including only some components of a display element layer.
Figure 15:
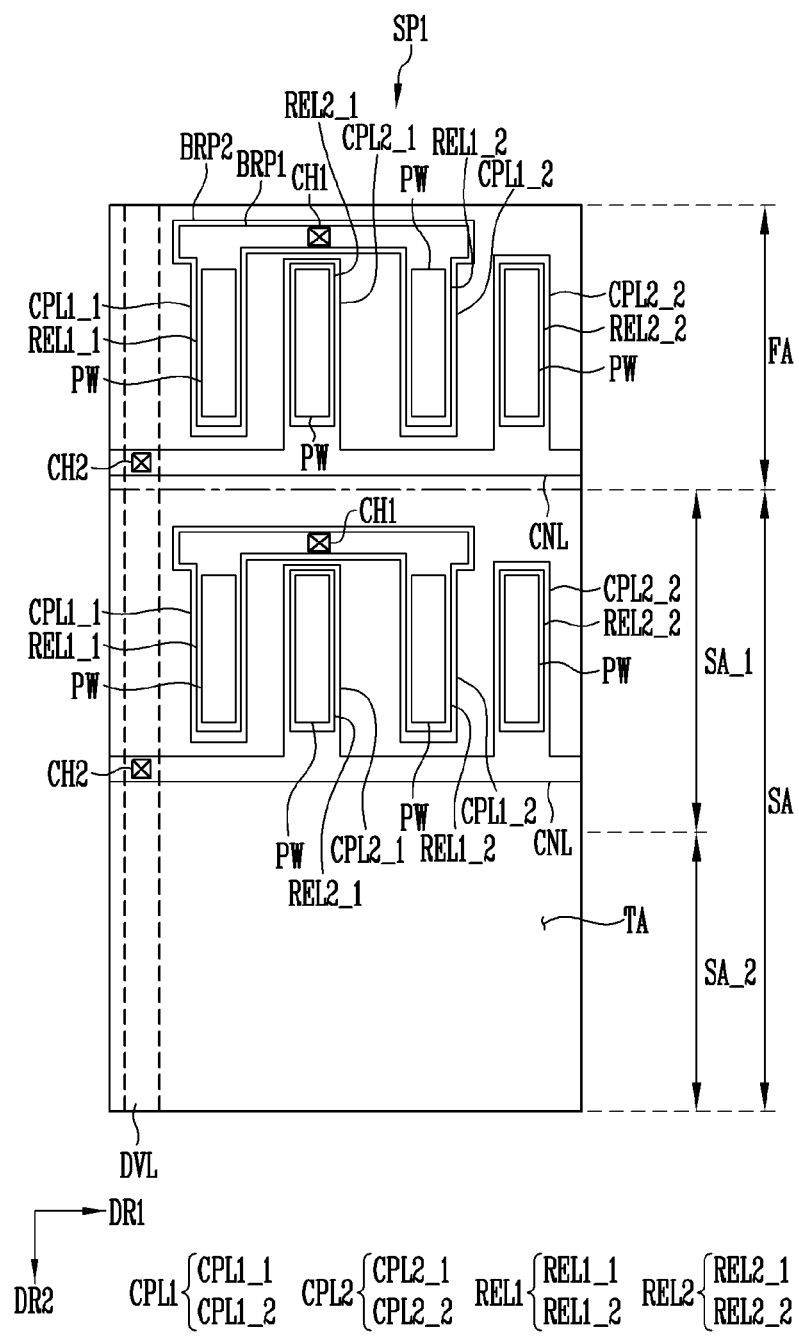

FIGS. 14 and 15 illustrate an embodiment of a first sub-pixel of FIG. 4, and are plan views schematically illustrating the first sub-pixel including only some components of a display element layer.

Therefore, to avoid redundant explanation, the description of the first sub-pixel of FIGS. 14 and 15 will be focused on differences from that of the foregoing embodiments. Components which are not separately explained in the following description of the embodiment comply with that of the foregoing embodiments. The same reference numeral will be used to designate the same component, and a similar reference numeral will be used to designate a similar component.

For the sake of illustration, FIGS. 14 and 15 illustrate only a driving voltage line, a partition wall, first and second electrodes, first and second capping layers, and a connection line.

Furthermore, for the sake of explanation, illustration of a transistor connected to the first electrode and signal lines connected to the transistor is omitted in FIGS. 14 and 15.

Referring to FIGS. 1A, 2, 4, 14, and 15, the first sub-pixel SP1 may include a first area FA in which a pixel circuit layer (refer to PCL of FIG. 5) may be disposed, and a second area SA adjacent to the first area FA. In an embodiment of the disclosure, the second area SA may include a 2-1th area SA_1 and a 2-2th area SA_2.

The first sub-pixel SP1 may include the substrate SUB, the pixel circuit layer PCL, and a display element layer DPL. (see FIG. 5)

The pixel circuit layer PCL may be disposed in the first area FA of the first sub-pixel SP1. The display element layer DPL may be provided in each of the first area FA and the second area SA of the first sub-pixel SP1.

In the first area FA, the display element layer DPL may be provided on the pixel circuit layer PCL and overlap with the pixel circuit layer PCL. The display element layer DPL disposed in the first area FA may include a partition wall PW, first and second electrodes REL1 and REL2, first and second capping layers CPL1 and CPL2, a connection line CNL, first and second bridge patterns BRP1 and BRP2, etc. Furthermore, in the first area FA, the display element layer DPL may further include, although not illustrated, light emitting elements LD provided between the first electrode REL1 and the second electrode REL2, a first contact electrode (refer to CNE1 of FIG. 5) provided on the first electrode REL1, and a second contact electrode (refer to CNE2 of FIG. 5) provided on the second electrode REL2.

The first electrode REL1 and the second electrode REL2 each may be provided on the partition wall PW, and may be spaced apart from each other.

The first electrode REL1 may be connected to the first bridge pattern BRP1. For example, the first electrode REL1 may be integrally provided with the first bridge pattern BRP1, and electrically and/or physically connected with the first bridge pattern BRP1. The first electrode REL1 may include a 1-1th electrode REL1_1 and a 1-2th electrode REL1_2 which diverge from the first bridge pattern BRP1 in a second direction DR2 (e.g., 'vertical direction'). In the case where the first electrode REL1 and the first bridge pattern BRP1 may be formed and/or provided integrally with each other, the first bridge pattern BRP1 may be regarded as one area of the first electrode REL1. However, the disclosure is not limited thereto. For example, in some embodiments, the first electrode REL1 and the first bridge pattern BRP1 may be formed separately from each other and electrically connected to each other through a contact hole, a via hole, or the like, which is not illustrated.

In an embodiment of the disclosure, the first bridge pattern BRP1 may extend in the first sub-pixel SP1 in a first direction DR1 intersecting with the second direction DR2. The first bridge pattern BRP1 may be provided only in the first sub-pixel SP1 so as to drive the first sub-pixel SP1 independently from sub-pixels adjacent thereto. The first bridge pattern BRP1 may be electrically connected to a first transistor (refer to T1 of FIG. 5) included in the pixel circuit layer PCL of the first area FA through the first contact hole CH1 of the passivation layer PSV. Since the first bridge pattern BRP1 may be integrally provided with the first electrode REL1, a signal applied to the first transistor T1 may be transmitted to the first electrode REL1 through the first bridge pattern BRP1.

The second electrode REL2 may include a 2-1th electrode REL2_1 and a 2-2th electrode REL2_2 spaced apart from each other with a 1-2th electrode REL1_2 interposed therebetween. The 2-1th electrode REL2_1 and the 2-2th electrode REL2_2 may extend in the second direction DR2 in the first area FA of the first sub-pixel SP1. The second electrode REL2 may be electrically and/or physically connected to the connection line CNL that may be integrally provided with the second capping layer CPL2.

The first capping layer CPL1 may be connected to the second bridge pattern BRP2. For example, the first capping layer CPL1 may be integrally provided with the second bridge pattern BRP2, and electrically and/or physically connected with the second bridge pattern BRP2. In the case where the first capping layer CPL1 and the second bridge pattern BRP2 may be formed and/or provided integrally with each other, the second bridge pattern BRP2 may be regarded as one area of the first capping layer CPL1. However, the disclosure is not limited thereto. For example, in some embodiments, the first capping layer CPL1 and the second bridge pattern BRP2 may be formed separately from each other and electrically connected to each other through a contact hole, a via hole, or the like, which is not illustrated.

The first capping layer CPL1 may include a 1-1th capping layer CPL1_1 and a 1-2th capping layer CPL1_2 which diverge from the second bridge pattern BRP2 in the second direction DR2. The 1-1th capping layer CPL1_1 may be provided on the 1-1th electrode REL1_1. The 1-2th capping layer CPL1_2 may be provided on the 1-2th electrode REL12.

The second bridge pattern BRP2 may extend in the first direction DR1 in the first sub-pixel SP1. The second bridge pattern BRP2 may be provided on the first bridge pattern BRP1 and electrically and/or physically connected with the first bridge pattern BRP1. In a plan view, the second bridge pattern BRP2 may overlap the first bridge pattern BRP1. In an embodiment, the second bridge pattern BRP2 may be omitted. In the case where the second bridge pattern BRP2 is omitted, the 1-1th capping layer CPL1_1 and the 1-2th capping layer CPL12 may be spaced apart from each other and electrically and/or physically separated from each other.

The second capping layer CPL2 may be connected to the connection line CNL. For example, the second capping layer CPL2 may be integrally provided with the connection line CNL, and electrically and/or physically connected with the connection line CNL. In the case where the second capping layer CPL2 and the connection line CNL may be integrally formed and/or provided, the connection line CNL may be regarded as one area of the second capping layer CPL2. However, the disclosure is not limited thereto. For example, in some embodiments, the second capping layer CPL2 and the connection line CNL may be formed separately from each other and electrically connected to each other through a contact hole, a via hole, or the like, which is not illustrated.

The second capping layer CPL2 may include a 2-1th capping layer CPL2_1 and a 2-2th capping layer CPL2_2 which diverge from the connection line CNL in the second direction DR2. The 2-1th capping layer CPL2_1 may be provided on the 2-1th electrode REL2_1. The 2-2th capping layer CPL2_2 may be provided on the 2-2th electrode REL2_2.

The connection line CNL may extend in a direction parallel to a direction in which the first and second bridge patterns BRP1 and BRP2 extend. The connection line CNL may be provided on the same layer as that of the second capping layer CPL2 and include the same material as that of the second capping layer CPL2. The connection line CNL may be connected to the driving voltage line DVL of the first sub-pixel SP1 through the second contact hole CH2 of the passivation layer PSV. Hence, the voltage of the second driving power supply (refer to VSS of FIG. 3A) that may be applied to the driving voltage line DVL may be transmitted to the connection line CNL.

The display element layer DPL may be provided in only a portion of the second area SA. For example, the display element layer DPL may be provided in only the 2-1th area SA_1 of the second area SA and may not be provided in the 2-2th area SA_2 of the second area SA. In an embodiment of the disclosure, the 2-2th area SA_2 may be an area in which the display element layer DPL may not be disposed, and be disposed between the first area FA and the 2-1th area SA1, as illustrated in FIG. 14. However, the disclosure is not limited thereto. In an embodiment, the 2-2th area SA_2 may be spaced apart from the first area FA with the 2-1th area SA1 interposed therebetween, as illustrated in FIG. 15.

Since the display element layer DPL provided in the 2-1th area SA_1 has the same configuration as that of the display element layer DPL provided in the first area FA, the description of the display element layer DPL provided in the first area FA will substitute for the description of the display element layer DPL provided in the 2-1th area SA_1.

In an embodiment of the disclosure, the first electrode REL1 disposed on the first area FA and the first electrode REL1 disposed on the 2-1th area SA1 may be electrically connected to the same transistor, e.g., the first transistor T1 of the pixel circuit layer PCL provided in the first area FA.

The 2-2th area SA2 may be an area in which the display element layer DPL may not be provided, and may include a transmission area TA through which light passes. The transmission area TA may be an area in which some components of the display element layer DPL, e.g., the first and second electrodes REL1 and REL2, may not be disposed, and may be an area from which light may not be emitted. As illustrated in FIG. 14, the transmission area TA may be disposed to correspond to a central area of the first sub-pixel SP1, but the disclosure is not limited thereto. In an embodiment, as illustrated in FIG. 15, the transmission area TA may be disposed to correspond to a lower area of the first sub-pixel SP1. In an embodiment of the disclosure, the position of the transmission area TA may be determined depending on the 2-2th area SA2 of the first sub-pixel SP1.

In an embodiment of the disclosure, the transmission area TA may have the same surface area (or size) as that of the 2-2th area SA_2 or have a surface area greater than that of the 2-2th area SA_2. The transmission area TA may be provided in such a way that all components of the display element layer DPL may not be disposed in the 2-2th area SA_2. However, the disclosure is not limited thereto. In an embodiment, the transmission area TA may be provided in such a way that some components of the display element layer DPL may not be disposed in the 2-2th area SA_2.

As described above, in the first area FA of the first sub-pixel SP1, the pixel circuit layer PCL and the display element layer DPL of the corresponding sub-pixel may be disposed, and the display element layer DPL may not be disposed in the 2-2th area SA_2 of the first sub-pixel SP1. Therefore, the aperture ratio of the first sub-pixel SP1 may be further increased.

Figure 16:
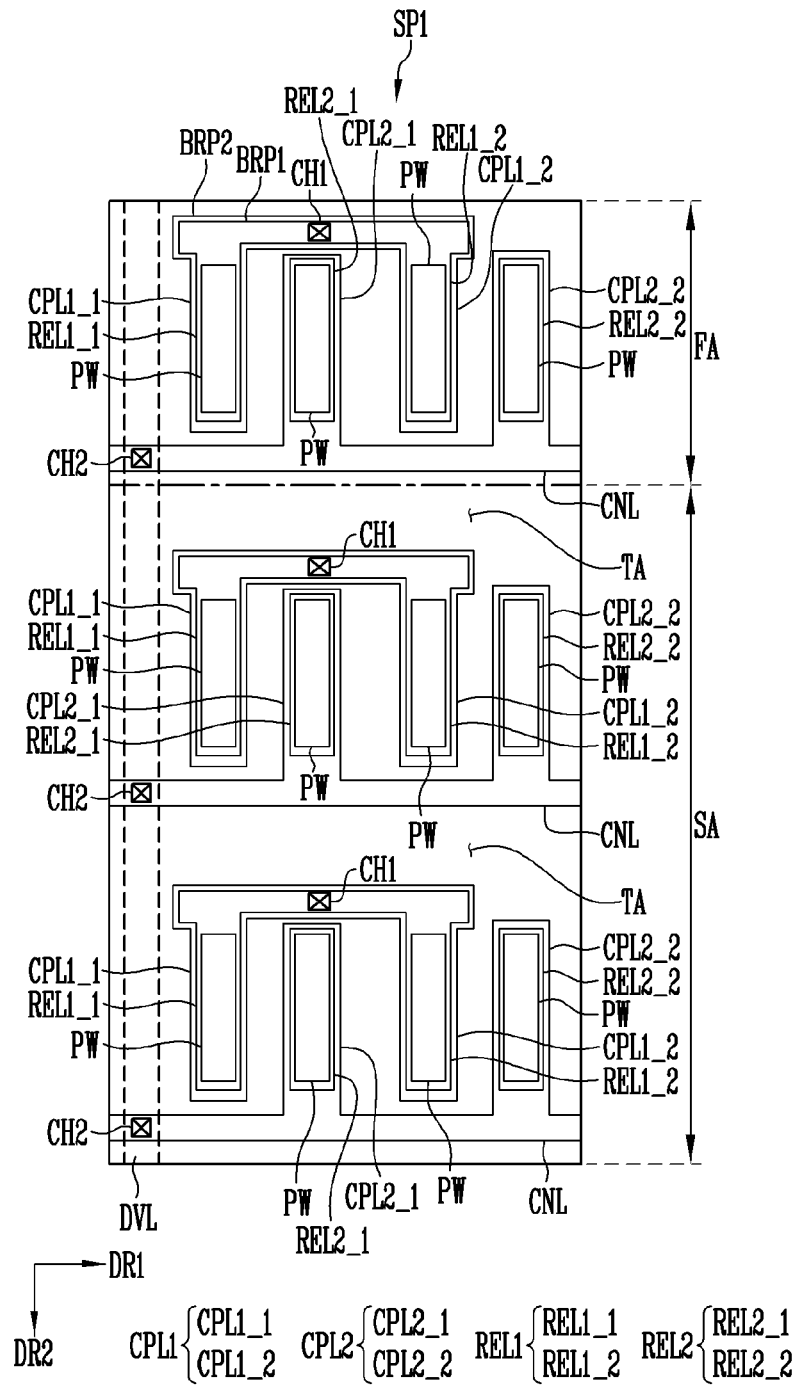
FIG. 16 illustrates an embodiment of the first sub-pixel of FIG. 14, and is a plan view schematically illustrating the first sub-pixel including only some components of the display element layer.

FIG. 16 illustrates an embodiment of the first sub-pixel of FIG. 14, and is a plan view schematically illustrating the first sub-pixel including only some components of the display element layer.

To avoid redundant explanation, the description of the first sub-pixel of FIG. 16 will be focused on differences from that of the foregoing embodiments. Components which are not separately explained in the following description of the embodiment comply with that of the foregoing embodiments. The same reference numeral will be used to designate the same component, and a similar reference numeral will be used to designate a similar component.

For the sake of illustration, FIG. 16 illustrates only a driving voltage line, a partition wall, first and second electrodes, first and second capping layers, and a connection line.

Furthermore, for the sake of explanation, illustration of a transistor connected to the first electrode, and signal lines connected to the transistor is omitted in FIG. 16.

Referring to FIGS. 1A, 2, 14, and 16, the first sub-pixel SP1 may include a first area FA, and a second area SA adjacent to the first area FA. The first sub-pixel SP1 may include the substrate SUB, a pixel circuit layer (refer to PCL of FIG. 5), and a display element layer (refer to DPL of FIG. 5).

The pixel circuit layer PCL and the display element layer DPL may be provided in the first area FA of the first sub-pixel SP1. In the case where the display element layer DPL is provided in the first area FA, the display element layer DPL may be provided on the pixel circuit layer PCL of the corresponding sub-pixel SP1 and overlap the pixel circuit layer PCL. Only the display element layer DPL may be provided in the second area SA of the first sub-pixel SP1.

The display element layers DPL that may be respectively provided in the first area FA and the second area SA may have the same configuration. In an embodiment of the disclosure, the display element layer DPL may include a partition wall PW, first and second electrodes REL1 and REL2, first and second capping layers CPL1 and CPL2, a connection line CNL, first and second bridge patterns BRP1 and BRP2, etc.

In an embodiment of the disclosure, the first electrode REL1 disposed in the first area FA and the first electrode REL1 disposed in the second area SA may be electrically connected to the same transistor, e.g., a first transistor (refer to T1 of FIG. 5) of the pixel circuit layer PCL provided in the first area FA.

The second area SA may include a transmission area TA through which light passes. The transmission area TA may be an area in which some components of the display element layer DPL, e.g., the first electrode REL1 and the second electrode REL2 which may be formed of conductive material having a reflectivity, may not be disposed, and may be an area from which light may not be emitted. In an embodiment of the present disclosure, the transmission area TA may be provided in such a way that some components of the display element layer DPL may not be disposed in the second area SA.

As described above, in the case where the second area SA of the first sub-pixel SP1 includes the transmission area TA, the aperture ratio of the first sub-pixel SP1 may be enhanced, and the light transmissivity may be increased.

Figure 17:
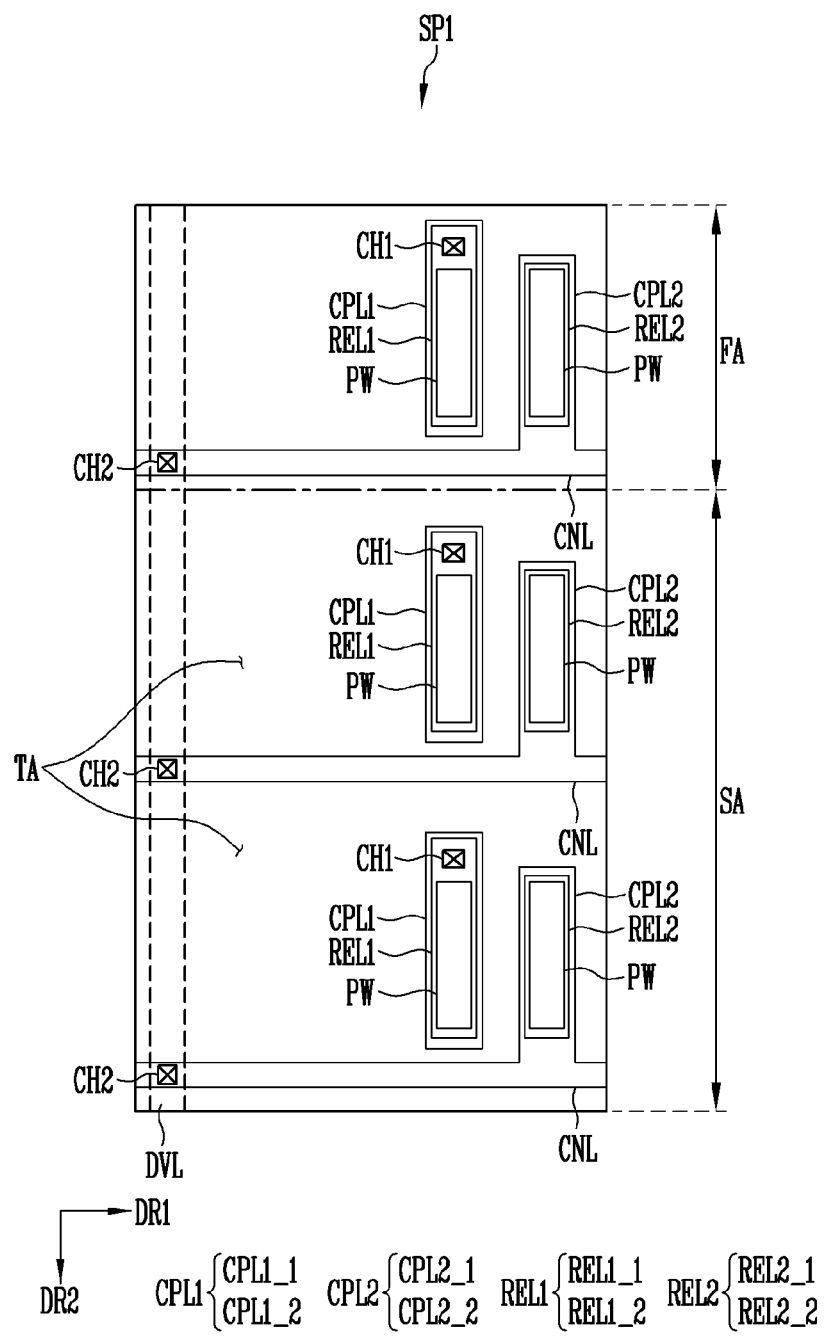
FIG. 17 illustrates an embodiment of the first sub-pixel of FIG. 8, and is a plan view schematically illustrating the first sub-pixel including only some components of the display element layer.

FIG. 17 illustrates an embodiment of the first sub-pixel of FIG. 8, and is a plan view schematically illustrating the first sub-pixel including only some components of the display element layer.

To avoid redundant explanation, the description of the first sub-pixel of FIG. 17 will be focused on differences from that of the foregoing embodiments. Components which are not separately explained in the following description of the embodiment comply with that of the foregoing embodiments. The same reference numeral will be used to designate the same component, and a similar reference numeral will be used to designate a similar component.

For the sake of illustration, FIG. 17 illustrates only a driving voltage line, a partition wall, first and second electrodes, first and second capping layers, and a connection line.

Furthermore, for the sake of explanation, illustration of a transistor connected to the first electrode, and signal lines connected to the transistor is omitted in FIG. 17.

Referring to FIGS. 1A, 2, 8, and 17, the first sub-pixel SP1 may include a first area FA in which a pixel circuit layer (refer to PCL of FIG. 5) may be disposed, and a second area SA adjacent to the first area FA. A display element layer (refer to DPL of FIG. 5) of the first sub-pixel SP1 may be provided in each of the first area FA and the second area SA.

In the first area FA, the display element layer DPL may include a partition wall PW, first and second electrodes REL1 and REL2, first and second capping layers CPL1 and CPL2, and a connection line CNL. In the second area SA, the display element layer DPL may also include a partition wall PW, first and second electrodes REL1 and REL2, first and second capping layers CPL1 and CPL2, and a connection line CNL.

The display element layer DPL provided in each of the first and second areas FA and SA may be disposed at a position biased to one side of the first sub-pixel SP1, e.g., to the right side, in a plan view, but the disclosure is not limited thereto. In an embodiment, the display element layer DPL provided in each of the first and second areas FA and SA may be disposed at a position biased to the left side or a central area of the first sub-pixel SP1, in a plan view, but the disclosure is not limited thereto.

As described above, in the case where the display element layer DPL is disposed at a position biased to some area in the second area SA of the first sub-pixel SP1, a transmission area TA through which light passes may be further secured in another area of the second area SA (e.g., in an area in which the display element layer DPL may not be disposed). Hence, the aperture ratio of the first sub-pixel SP1 may be enhanced, and the light transmissivity of the first sub-pixel SP1 may be increased.

Figure 18:
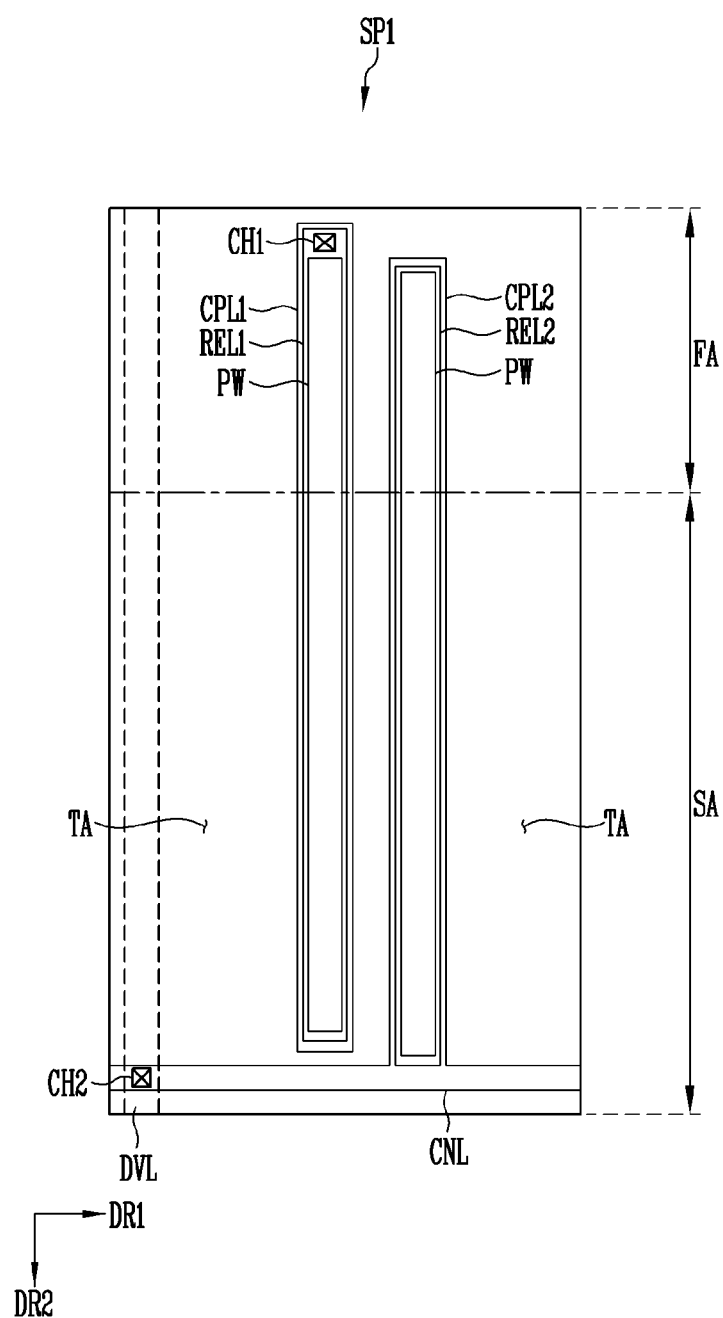
FIG. 18 illustrates an embodiment of the first sub-pixel of FIG. 4, and is a plan view schematically illustrating the first sub-pixel including only some components of the display element layer.

FIG. 18 illustrates an embodiment of the first sub-pixel of FIG. 4, and is a plan view schematically illustrating the first sub-pixel including only some components of the display element layer.

For the sake of illustration, FIG. 18 illustrates only a driving voltage line, a partition wall, first and second electrodes, first and second capping layers, and a connection line.

Furthermore, for the sake of explanation, illustration of a transistor connected to the first electrode, and signal lines connected to the transistor is omitted in FIG. 18.

Referring to FIGS. 1A, 2, 4, and 18, the first sub-pixel SP1 may include the substrate SUB, a pixel circuit layer (refer to PCL of FIG. 5), and a display element layer (refer to DPL of FIG. 5). The first sub-pixel SP1 may include a first area FA and a second area SA. In an embodiment of the present disclosure, the first area FA may be an area in which the pixel circuit layer PCL may be disposed, and the second area SA may be an area adjacent to the first area FA.

The pixel circuit layer PCL and the display element layer DPL may be provided in the first area FA.

The pixel circuit layer PCL may include first and second transistors (refer to T1 and T2 of FIG. 5) provided on the substrate SUB, a driving voltage line DVL, and a passivation layer (refer to PSV of FIG. 5) including first and second contact holes CH1 and CH2.

The display element layer DPL may include a partition wall PW, first and second electrodes REL1 and REL2, first and second capping layers CPL1 and CPL2, a connection line CNL, etc. Furthermore, the display element layer DPL may further include, although not illustrated, light emitting elements LD aligned between the first electrode REL1 and the second electrode REL2, a first contact electrode CNE1 provided on the first electrode REL1, and a second contact electrode CNE2 provided on the second electrode REL2.

The partition wall PW may be provided on the passivation layer PSV, and extend, in a plan view, from the first area FA of the first sub-pixel SP1 to the second area SA in a second direction DR2 (e.g., 'vertical direction').

The first electrode REL1 and the second electrode REL2 each may be provided on the partition wall PW, and may be spaced apart from each other. In an embodiment of the disclosure, the first electrode REL1 and the second electrode REL2 each may be provided in a shape corresponding to the partition wall PW. In detail, each of the first electrode REL1 and the second electrode REL2 may have a bar shape extending from the first area FA of the first sub-pixel SP1 to the second area SA in the second direction DR2.

The first electrode REL1 may be electrically connected to the first transistor T1 of the pixel circuit layer PCL through the first contact hole CH1 of the passivation layer PSV. The second electrode REL2 may be electrically connected to the driving voltage line DVL through the connection line CNL.

The first capping layer CPL1 may be provided on the first electrode REL1 and have a shape corresponding to the first electrode REL1. In detail, the first capping layer CPL1 may have a bar shape extending from the first area FA of the first sub-pixel SP1 to the second area SA in the second direction DR2. The second capping layer CPL2 may be provided on the second electrode REL2 and have a shape corresponding to the second electrode REL2. In detail, the second capping layer CPL2 may have a bar shape extending from the first area FA of the first sub-pixel SP1 to the second area SA in the second direction DR2.

The connection line CNL may extend in a first direction DR1 (e.g., 'horizontal direction') intersecting with the second direction DR2. The connection line CNL may be provided on the same layer as that of the second capping layer CPL2 and include the same material as that of the second capping layer CPL2. In detail, the connection line CNL and the second capping layer CPL2 may be integrally provided and electrically and/or physically connected to each other. In the case where the second capping layer CPL2 and the connection line CNL may be integrally formed and/or provided, the connection line CNL may be regarded as one area of the second capping layer CPL2.

The connection line CNL may be connected to the driving voltage line DVL through the second contact hole CH2 of the passivation layer PSV. The voltage of a second driving power supply (VSS of FIG. 3A) that may be applied to the driving voltage line DVL may be transmitted to the second electrode REL2 through the second capping layer CPL2.

In an embodiment of the disclosure, the display element layer DPL provided in the first sub-pixel SP1 may be disposed at a position biased to a central area of the first sub-pixel SP1 in a plan view, but the disclosure is not limited thereto. In an embodiment, the display element layer DPL provided in the first sub-pixel SP1 may be disposed at a position biased to a right or left area of the first sub-pixel SP1 in a plan view.

As described above, in the case where the display element layer DPL is disposed at a position biased to some area in the first area FA and the second area SA of the first sub-pixel SP1, a transmission area TA through which light passes may be further secured in another area of the second area SA (e.g., in an area in which the display element layer DPL may not be disposed). Hence, the aperture ratio of the first sub-pixel SP1 may be enhanced, and the light transmissivity of the first sub-pixel SP1 may be increased.

In an embodiment of the disclosure, the transmission area TA may include a left area and a right area which may be provided on opposite sides of a central area where the display element layer DPL may be disposed in the second area SA of the first sub-pixel SP1. However, the disclosure is not limited thereto. The transmission area TA may include all remaining areas in the second area SA of the first sub-pixel SP1 other than the area where the first and second electrodes REL1 and REL2 of the display element layer DPL may be disposed.

Figure 19:
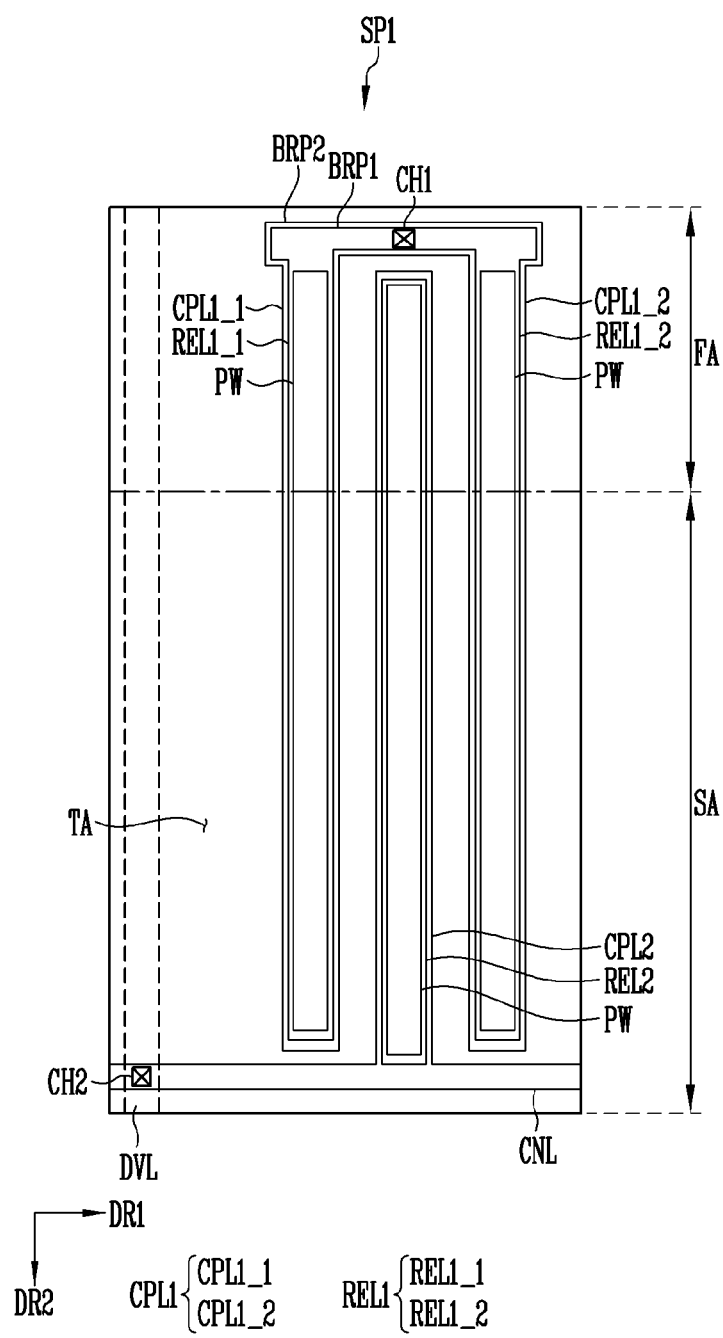
FIG. 19 illustrates an embodiment of the first sub-pixel of FIG. 18, and is a plan view schematically illustrating the first sub-pixel including only some components of the display element layer.

FIG. 19 illustrates an embodiment of the first sub-pixel of FIG. 18, and is a plan view schematically illustrating the first sub-pixel including only some components of the display element layer.

The configuration of the first sub-pixel of FIG. 19, other than the fact that the first electrode thereof includes a 1-1th electrode and a 1-2th electrode, and the 1-1th electrode and the 1-2th electrode may be integrally provided with a first bridge pattern, may be substantially equal or similar to that of the first sub-pixel of FIG. 18.

Therefore, to avoid redundant explanation, the description of the first sub-pixel of FIG. 19 will be focused on differences from that of the foregoing embodiments. Components which are not separately explained in the following description of the embodiment of the disclosure comply with that of the foregoing embodiments. The same reference numeral will be used to designate the same component, and a similar reference numeral will be used to designate a similar component.

For the sake of illustration, FIG. 19 illustrates only a driving voltage line, a partition wall, first and second electrodes, first and second capping layers, a connection line, and first and second bridge patterns.

Furthermore, for the sake of explanation, illustration of a transistor connected to the first electrode, and signal lines connected to the transistor is omitted in FIG. 19.

Referring to FIGS. 1A, 2, and 19, the first sub-pixel SP1 may include the substrate SUB, a pixel circuit layer (refer to PCL of FIG. 5), and a display element layer (refer to DPL of FIG. 5). The first sub-pixel SP1 may include a first area FA and a second area SA. In an embodiment of the disclosure, the first area FA may be an area in which the pixel circuit layer PCL may be disposed, and the second area SA may be an area adjacent to the first area FA.

The pixel circuit layer PCL and the display element layer DPL may be provided in the first area FA.

The display element layer DPL in the first area FA may include a partition wall PW, first and second electrodes REL1 and REL2, first and second capping layers CPL1 and CPL2, first and second bridge patterns BRP1 and BRP2, a connection line CNL, etc. Although not directly illustrated in the drawings, the display element layer DPL may further include light emitting elements LD, a first contact electrode (refer to CNE1 of FIG. 5), and a second contact electrode (refer to CNE2 of FIG. 5).

The first electrode REL1 may be connected to the first bridge pattern BRP1 extending in a first direction DR1 (e.g., 'horizontal direction'). The first electrode REL1 may include a 1-1th electrode REL1_1 and a 1-2th electrode REL1_2 which diverge from the first bridge pattern BRP1 in a second direction DR2 intersecting with the first direction DR1. The 1-1th electrode REL1_1 and the 1-2th electrode REL1_2 may have a bar shape extending from the first area FA of the first sub-pixel SP1 to the second area SA. The 1-1th electrode REL1_1 and the 1-2th electrode REL1_2 may be integrally provided with the first bridge pattern BRP1 and electrically and/or physically connected to the first bridge pattern BRP1.

The second electrode REL2 may have a bar shape extending from the first area FA of the first sub-pixel SP1 to the second area SA in the second direction DR2. The second electrode REL2 may be provided between the 1-1th electrode REL1_1 and the 1-2th electrode REL1_2 and spaced apart from each of the 1-1th and 1-2th electrodes REL1_1 and REL12.

In the case where the first electrode REL1 and the second electrode REL2 each have the above-mentioned configuration, the light emitting elements LD may be aligned between the 1-1th electrode REL1_1 and the second electrode REL2 and between the second electrode REL2 and the 1-2th electrode REL1_2 in case that the light emitting elements LD may be aligned in the first sub-pixel SP1. Since each of the first electrode REL1 and the second electrode REL2 may be provided in a shape extending from the first area FA of the first sub-pixel SP1 to the second area SA, the light emitting elements LD may be uniformly aligned over the first and second areas FA and SA of the first sub-pixel SP1. The number of light emitting elements LD aligned in the first sub-pixel SP1 may be increased, so that the intensity of light emitted from the first sub-pixel SP1 may be enhanced.

In an embodiment of the disclosure, the second area SA of the first sub-pixel SP1 may include a transmission area TA through which light passes. The transmission area TA may be provided in such a way that components which impede transmission of light drawn through the rear surface and/or front surface of the substrate SUB, e.g., the pixel circuit layer PCL and the display element layer DPL, may not be disposed.

In an embodiment of the disclosure, the display element layer DPL may be disposed at a position biased to one side, e.g., a right area, of the first sub-pixel SP1, in a plan view. In the case where the display element layer DPL may be disposed at a position biased to a specific area in the first sub-pixel SP1, the transmission area TA may be further secured in another area of the first sub-pixel SP1, e.g., in an area where the display element layer DPL may not be disposed. Hence, the aperture ratio of the first sub-pixel SP1 may be enhanced, and the light transmissivity of the first sub-pixel SP1 may be increased.

Figure 20:
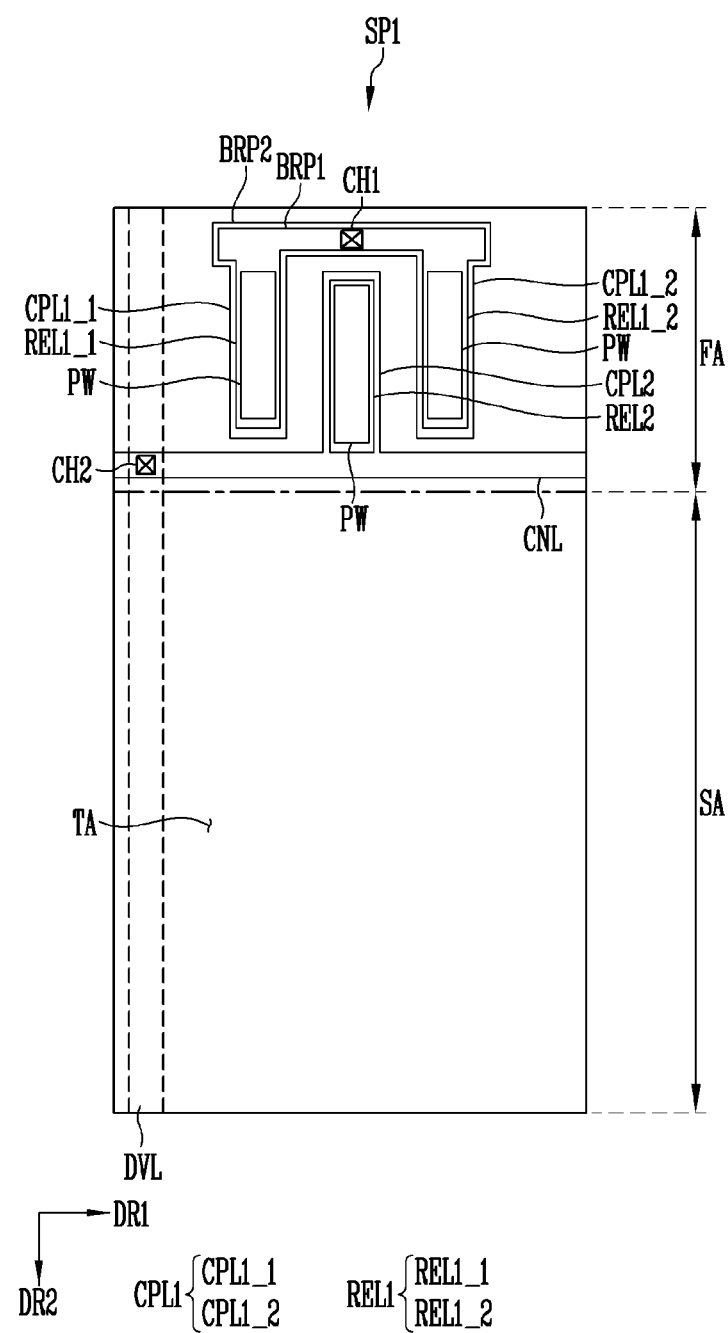
FIG. 20 illustrates an embodiment of the first sub-pixel of FIG. 10, and is a plan view schematically illustrating the first sub-pixel including only some components of the display element layer.

FIG. 20 illustrates an embodiment of the first sub-pixel of FIG. 10, and is a plan view schematically illustrating the first sub-pixel including only some components of the display element layer.

The configuration of the first sub-pixel of FIG. 20, other than the fact that the first electrode includes a 1-1th electrode and a 1-2th electrode, may be substantially equal or similar to that of the first sub-pixel of FIG. 10.

Therefore, to avoid redundant explanation, the description of the first sub-pixel of FIG. 20 will be focused on differences from that of the foregoing embodiments. Components which are not separately explained in the following description of the embodiment of the disclosure comply with that of the foregoing embodiments. The same reference numeral will be used to designate the same component, and a similar reference numeral will be used to designate a similar component.

For the sake of illustration, FIG. 20 illustrates only a driving voltage line, a partition wall, first and second electrodes, first and second capping layers, a connection line, and first and second bridge patterns.

Furthermore, for the sake of explanation, illustration of a transistor connected to the first electrode, and signal lines connected to the transistor is omitted in FIG. 20.

Referring to FIGS. 1A, 2, 10, and 20, the first sub-pixel SP1 may include a pixel circuit layer (refer to PCL of FIG. 5), and a display element layer (refer to DPL of FIG. 5). The first sub-pixel SP1 may include a first area FA and a second area SA. In an embodiment of the disclosure, the first area FA may be an area in which the pixel circuit layer PCL may be disposed, and the second area SA may be an area adjacent to the first area FA.

The pixel circuit layer PCL and the display element layer DPL may be provided in the first area FA. The pixel circuit layer PCL and the display element layer DPL may not be provided in the second area SA. In the first area FA, the display element layer DPL may be provided on the pixel circuit layer PCL and overlap the pixel circuit layer PCL.

The display element layer DPL may include a partition wall PW, first and second electrodes REL1 and REL2, first and second capping layers CPL1 and CPL2, first and second bridge patterns BRP1 and BRP2, a connection line CNL, etc. Although not directly illustrated in the drawings, the display element layer DPL may further include light emitting elements LD, a first contact electrode CNE1, and a second contact electrode CNE2.

The first electrode REL1 may be connected to the first bridge pattern BRP1 and include a 1-1th electrode REL1_1 and a 1-2th electrode REL1_2 which diverge from the first bridge pattern BRP1 in a second direction DR2 (e.g., 'vertical direction'). The 1-1th electrode REL1_1 and the 1-2th electrode REL1_2 may be spaced apart from each other with the second electrode REL2 interposed therebetween, in the first area FA of the first sub-pixel SP1.

The 1-1th electrode REL1_1, the 1-2th electrode REL1_2, and the first bridge pattern BRP1 may be integrally provided and electrically and/or physically connected to each other.

The second electrode REL2 may be provided in the first area FA of the first sub-pixel SP1 in the second direction DR2. The second electrode REL2 may be provided between the 1-1th electrode REL1_1 and the 1-2th electrode REL1_2 and spaced apart from each of the 1-1th and 1-2th electrodes REL1_1 and REL1_2.

In the case where the first electrode REL1 and the second electrode REL2 may be provided in only the first area FA of the first sub-pixel SP1, the light emitting elements LD may be aligned between the 1-1th electrode REL1_1 and the second electrode REL2 and between the second electrode REL2 and the 1-2th electrode REL1_2 in case that the light emitting elements LD may be aligned in the first sub-pixel SP1. In other words, the light emitting elements LD may be aligned in only the first area FA of the first sub-pixel SP1. The transmission area TA that may be provided in such a way that the display element layer DPL may not be disposed may have the same surface area (or size) as that of the second area SA of the first sub-pixel SP1. In other words, the transmission area TA of the first sub-pixel SP1 may be the second area SA.

As described above, in a specific area of each of the first sub-pixel SP1, i.e., in the first area FA, the pixel circuit layer PCL and the display element layer DPL of the corresponding sub-pixel SP1 may be disposed, and the display element layer DPL may not be disposed in the second area SA. Consequently, the transmission area TA of the corresponding sub-pixel SP1 may be further increased. Hence, the aperture ratio of the first sub-pixel SP1 may be enhanced, and the light transmissivity of the corresponding sub-pixel SP1 may be increased.

While various embodiments have been described above, those skilled in the art will appreciate that various modifications, additions and substitutions are possible, without departing from the scope and spirit of the disclosure.

Therefore, the embodiments disclosed in this specification are only for illustrative purposes rather than limiting the technical spirit of the disclosure. The scope of the disclosure must be defined by the accompanying claims including equivalents thereof

What is claimed is:
1. A display device comprising:
a substrate including a display area and a non-display area enclosing a perimeter of the display area; and
pixels disposed in the display area, and each of the pixels including sub-pixels,
wherein
each of the sub-pixels comprises:
a pixel circuit layer; and
a display element layer including at least one light emitting element that emits light,
the display element layer comprises:
first and second electrodes disposed on a same surface and spaced apart from each other;
the at least one light emitting element disposed between the first electrode and the second electrode;
a first contact electrode that electrically connects an end of the at least one light emitting element to the first electrode; and
a second contact electrode that electrically connects another end of the at least one light emitting element to the second electrode, and
each of the sub-pixels includes:
a first area in which the pixel circuit layer is disposed; and
a second area in which the pixel circuit layer is not disposed, the second area adjacent to the first area, the second area including a transmission area through which the light passes, wherein at least a portion of the transmission area overlaps an edge of one of the first contact electrode or the second contact electrode.

2. The display device according to claim 1, wherein a light transmissivity of the second area is higher than a light transmissivity of the first area.

3. The display device according to claim 2, wherein the display element layer is disposed in at least one of the first area and the second area.

4. The display device according to claim 3, wherein the display element layer comprises:
a first capping layer disposed on the first electrode and electrically connected to the first electrode; and
a second capping layer disposed on the second electrode and electrically connected to the second electrode, wherein the first capping layer and the second capping layer are made of transparent conductive material.

5. The display device according to claim 4, wherein the pixel circuit layer comprises:
at least one transistor disposed on the substrate and electrically connected to the at least one light emitting element;
a driving voltage line disposed on the substrate and extending from the first area to the second area; and
a passivation layer disposed over the transistor and the driving voltage line.

6. The display device according to claim 5, wherein the display element layer is disposed in each of the first area and the second area.

7. The display device according to claim 6, wherein the first electrode and the second electrode extend from the first area to the second area.

8. The display device according to claim 6, wherein
the first electrode and the second electrode are disposed in each of the first area and the second area,
the first electrode disposed in the first area and the first electrode disposed in the second area are spaced apart from each other, and
the second electrode disposed in the first area and the second electrode disposed in the second area are spaced apart from each other.

9. The display device according to claim 8, wherein
in each of the sub-pixels, the first capping layer extends from the first area to the second area and electrically connects the first electrode of the first area to the first electrode of the second area, and
in each of the sub-pixels, the second capping layer extends from the first area to the second area and electrically couples the second electrode of the first area to the second electrode of the second area.

10. The display device according to claim 5, wherein the display element layer is disposed in the first area and overlaps the pixel circuit layer.

11. The display device according to claim 10, wherein the display element layer further comprises a connection line that electrically connects the driving voltage line to the second electrode.

12. The display device according to claim 11, wherein the connection line and the second capping layer are integral with each other.

13. The display device according to claim 11, wherein the connection line and the second electrode are integral with each other.

14. The display device according to claim 5,
wherein the second area comprises:
a 2-1th area in which the display element layer is disposed, and a 2-2th area adjacent to the 2-1th area, and
the display element layer is not disposed in the 2-2th area.

15. The display device according to claim 14, further comprising an additional conductive pattern that electrically connects the driving voltage line to the second electrode and is disposed in the second area.

16. The display device according to claim 15, wherein the additional conductive pattern and the driving voltage line are integral with each other, and
The additional conductive pattern is electrically connected to the second electrode through a contact hole passing through the passivation layer.

17. The display device according to claim 5, wherein
a light shielding layer is disposed in the first area of each of the sub-pixels, and the light shielding layer is disposed between the substrate and the transistor.

18. The display device according to claim 17, wherein the light shielding layer blocks light from a rear surface of the substrate.

19. The display device according to claim 1, wherein the at least one light emitting element comprises a light emitting diode having a shape of a cylinder or polyprism and having a microscale or nanoscale size.

20. A display device comprising:
a substrate including a display area and a non-display area enclosing a perimeter of the display area; and
pixels disposed in the display area, each of the pixels comprising sub-pixels,
wherein
each of the sub-pixels comprises:
first and second areas adjacent to each other;
a pixel circuit layer disposed in the first area and not disposed in the second area; and
a display element layer including at least one light emitting element that emits light,
wherein the display element layer comprises:
first and second electrodes disposed on each of the first and the second areas, and spaced apart from each other;
the at least one light emitting element disposed between the first electrode and the second electrode in each of the first and the second areas;
a capping layer disposed on each of the first and the second electrodes and extending from the first area to the second area;
a first contact electrode that electrically connects an end of the at least one light emitting element to the first electrode in each of the first and the second areas; and
a second contact electrode that electrically connects another end of the at least one light emitting element to the second electrode in each of the first and the second areas, and
the second area includes a transmission area through which the light passes, wherein at least a portion of the transmission area overlaps an edge of one of the first contact electrode or the second contact electrode.

21. The display device of claim 1, wherein
each of the sub-pixels comprise an emission area and a peripheral area, and
at least a portion of the transmission area of a sub-pixel overlaps a corresponding emission area in a plan view.

22. The display device of claim 1, wherein at least a portion of the transmission area of at least one of the sub-pixels surrounds a corresponding first electrode, at least one light emitting element, and second electrode in a plan view.

23. The display device of claim 1, wherein the transmission area of at least one of the sub-pixels includes a first transmission area and a second transmission area spaced apart from the first transmission area in a plan view by a corresponding first electrode, at least one light emitting element, and second electrode.

24. The display device of claim 1, wherein at least a second portion of the transmission area overlaps a second edge of the second contact electrode or the first contact electrode.

* * * * *